(12) United States Patent
Fujii et al.

(10) Patent No.: US 7,399,704 B2
(45) Date of Patent: Jul. 15, 2008

(54) FABRICATION METHOD OF A SEMICONDUCTOR DEVICE USING LIQUID REPELLENT FILM

(75) Inventors: Gen Fujii, Kanagawa (JP); Shinji Maekawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 195 days.

(21) Appl. No.: 10/954,286

(22) Filed: Oct. 1, 2004

(65) Prior Publication Data

US 2005/0074963 A1     Apr. 7, 2005

(30) Foreign Application Priority Data

Oct. 2, 2003  (JP)  .............................. 2003-344880

(51) Int. Cl.
   *H01L 21/44*     (2006.01)
(52) U.S. Cl. ................ 438/674; 438/612; 257/E21.011
(58) Field of Classification Search ................... 438/99, 438/623, 622, 618, 612, 674, 637, 725; 257/E21.595, 257/E21.256, E21.257, E21.26, E21.413, 257/E21.414, E21.577, E21.703, E27.111
See application file for complete search history.

(56) References Cited

U.S. PATENT DOCUMENTS

| 5,247,375 | A |  | 9/1993 | Mochizuki et al. |
| 5,483,082 | A |  | 1/1996 | Takizawa et al. |
| 5,580,796 | A |  | 12/1996 | Takizawa et al. |
| 5,610,414 | A |  | 3/1997 | Yoneda et al. |
| 5,908,721 | A | * | 6/1999 | Emoto et al. ................... 430/7 |
| 5,939,771 | A |  | 8/1999 | Usami et al. |

(Continued)

FOREIGN PATENT DOCUMENTS

CN    1158005    8/1997

(Continued)

OTHER PUBLICATIONS

Tetsuo Tsutsui et al., "Electroluminescence in Organic Film Films", Photochemical Processes in Organized Molecular Systems, 1991, pp. 437-450.

(Continued)

*Primary Examiner*—Michelle Estrada
*Assistant Examiner*—Jarrett J Stark
(74) *Attorney, Agent, or Firm*—Nixon Peabody LLP; Jeffrey L. Costellia

(57) ABSTRACT

In the case where a contact hole is formed by a conventional process of the semiconductor device fabrication, a resist is required to be formed almost entirely over a substrate in order to form the resist over the film where the contact hole is not formed. Accordingly, the throughput is considerably low. Further, when the resist spreads to the area of the contact hole when the amount of the resist to be applied and the surface state of the base are not fully controlled, contact defect would occur. Thus, improvements are required. According to the invention, in forming a semiconductor device, a part to be a contact hole of the semiconductor device may be covered with a first organic film that is liquid repellent. Subsequently, a second organic film serving as an insulating film is formed on the area where the first organic film is not formed, and the first organic film is removed thereafter to form a contact hole.

78 Claims, 19 Drawing Sheets

U.S. PATENT DOCUMENTS

| | | |
|---|---|---|
| 6,429,400 B1 | 8/2002 | Sawada et al. |
| 6,660,545 B2 | 12/2003 | Furusawa |
| 6,715,871 B2 | 4/2004 | Hashimoto et al. |
| 2002/0014470 A1* | 2/2002 | Okada et al. ............... 216/24 |
| 2002/0046681 A1* | 4/2002 | Hirose .................. 106/31.48 |
| 2002/0046682 A1* | 4/2002 | Fan et al. ............... 106/287.11 |
| 2002/0128515 A1 | 9/2002 | Ishida et al. |
| 2002/0151171 A1 | 10/2002 | Furusawa |
| 2002/0182890 A1* | 12/2002 | Ishida et al. ............. 438/780 |
| 2003/0030689 A1* | 2/2003 | Hashimoto et al. ............ 347/20 |
| 2003/0054653 A1 | 3/2003 | Yamazaki et al. |
| 2003/0059975 A1* | 3/2003 | Sirringhaus et al. ............ 438/99 |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0148401 A1* | 8/2003 | Agrawal et al. ............. 435/7.9 |
| 2004/0050685 A1 | 3/2004 | Yara et al. |
| 2004/0075396 A1 | 4/2004 | Okumura et al. |
| 2005/0001967 A1* | 1/2005 | Chae et al. ................ 349/139 |
| 2005/0005799 A1* | 1/2005 | Hirai ...................... 101/483 |
| 2005/0007398 A1* | 1/2005 | Hirai ........................ 347/1 |
| 2005/0025880 A1* | 2/2005 | Masuda .................... 427/58 |
| 2005/0043186 A1* | 2/2005 | Maekawa et al. .......... 505/741 |
| 2005/0051770 A1* | 3/2005 | Ando et al. ................. 257/40 |
| 2005/0158665 A1 | 7/2005 | Maekawa et al. |
| 2005/0170565 A1 | 8/2005 | Fujii et al. |

FOREIGN PATENT DOCUMENTS

| | | | |
|---|---|---|---|
| EP | 1340838 A1 | | 9/2003 |
| JP | 06-202153 | | 7/1994 |
| JP | 07-024579 | | 1/1995 |
| JP | 09-320363 | | 12/1997 |
| JP | 10-112499 | | 4/1998 |
| JP | 11-326951 | | 11/1999 |
| JP | 11-340129 | | 12/1999 |
| JP | 11-340219 | | 12/1999 |
| JP | 2000-039213 | | 2/2000 |
| JP | 2000035511 A | * | 2/2000 |
| JP | 2000-068233 | | 3/2000 |
| JP | 2001-068827 | | 3/2001 |
| JP | 2001-093871 | | 4/2001 |
| JP | 2001-179167 | | 7/2001 |
| JP | 2002-066391 | | 3/2002 |
| JP | 2002-151478 | | 5/2002 |
| JP | 2002-151524 | | 5/2002 |
| JP | 2002-237463 | | 8/2002 |
| JP | 2002-237480 | | 8/2002 |
| JP | 2002-289864 | | 10/2002 |
| JP | 2002-324966 | | 11/2002 |
| JP | 2002-359246 | | 12/2002 |
| JP | 2002-359347 | | 12/2002 |
| JP | 2003-017413 | | 1/2003 |
| JP | 2003-197531 | | 7/2003 |
| JP | 2003-311197 | | 11/2003 |
| JP | 2003-347284 | | 12/2003 |
| WO | WO 01/11426 A1 | | 2/2001 |
| WO | WO-01-47044 A2 | | 6/2001 |
| WO | WO-02-40742 A1 | | 5/2002 |
| WO | WO-2004-70809 A1 | | 8/2004 |
| WO | WO-2004-70810 A1 | | 8/2004 |
| WO | WO-2004-70811 A1 | | 8/2004 |
| WO | WO-2004-70819 A1 | | 8/2004 |
| WO | WO-2004-70820 A1 | | 8/2004 |
| WO | WO-2004-70821 A1 | | 8/2004 |
| WO | WO-2004-70822 A1 | | 8/2004 |
| WO | WO-2004-70823 A1 | | 8/2004 |
| WO | WO-2005-022262 A1 | | 3/2005 |

OTHER PUBLICATIONS

M.A. Baldo et al., "Highly efficient phosphorescent emission from organic electroluminescent devices", Nature, vol. 395, Sep. 10, 1998, pp. 151-154.

M.A. Baldo et al., "Very high-efficiency green organic light-emitting devices based on electrophosphorescence", Applied Physics Letters, Jul 5, 1999, vol. 75, No. 1, pp. 4-6.

Tetsuo Tsutsui et al., "High Quantum Efficiency in Organic Light-Emitting Devices with Iridium-Complex as a Triplet Emissive Center", Jpn. J. Appl. Phys., vol. 38 (1999), Part 2, No. 12B, Dec. 15, 1999, pp. L1502-L1504.

Office Action from Patent Office of the People's Republic of China for Application No. 200410083142.5, dated Sep. 14, 2007.

* cited by examiner

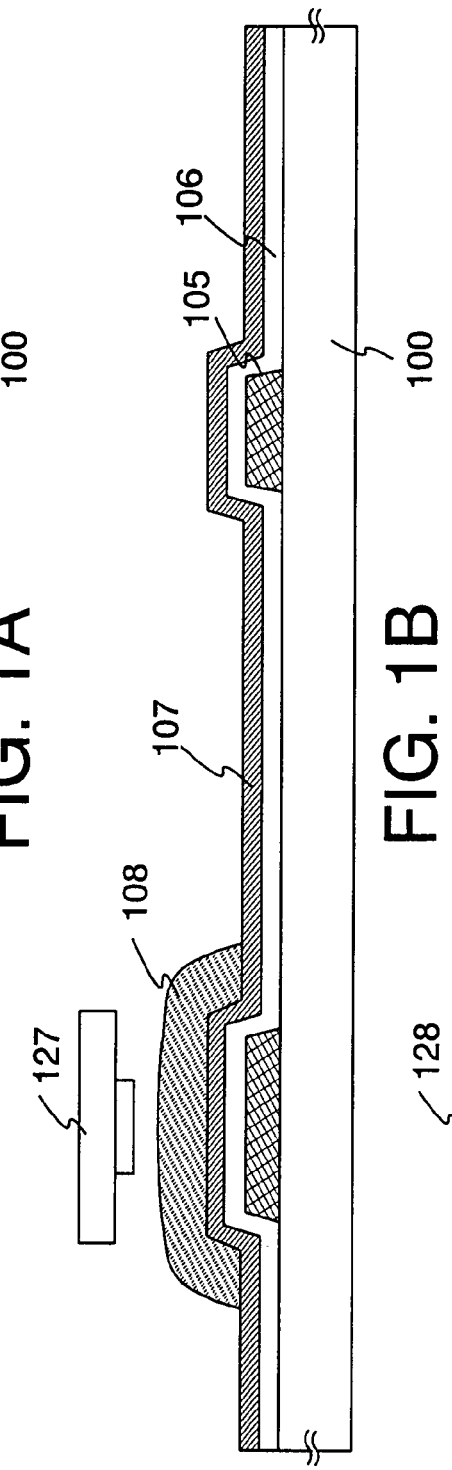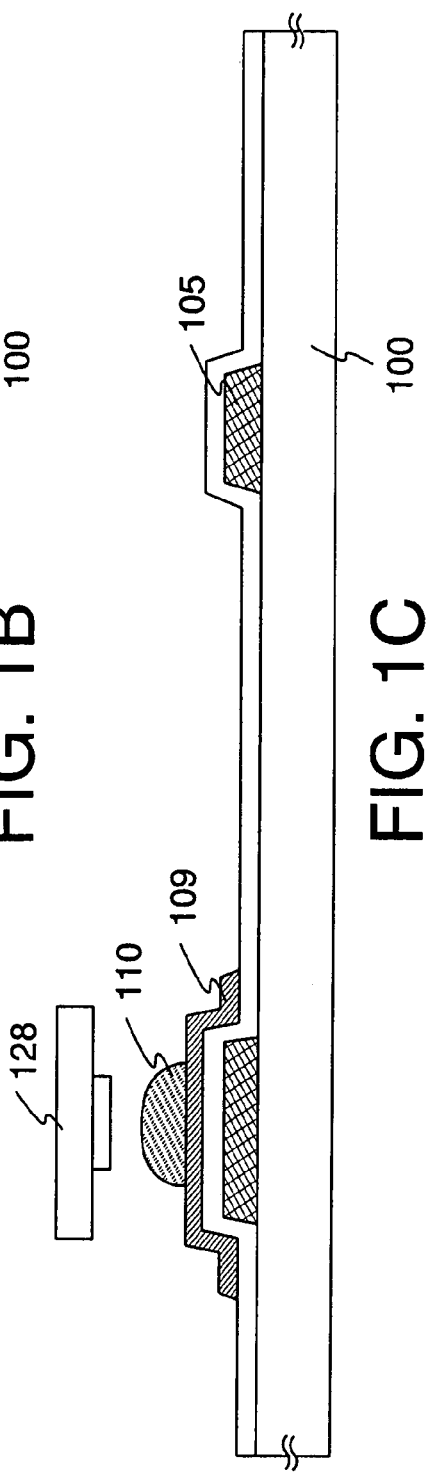

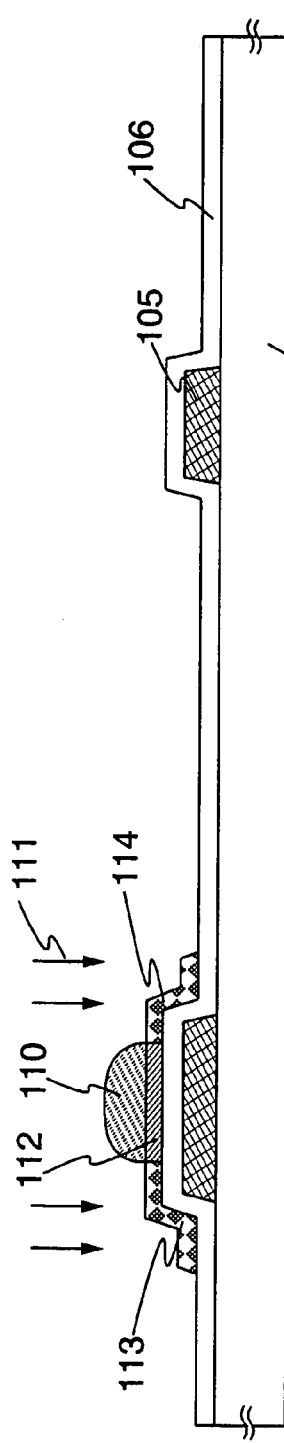
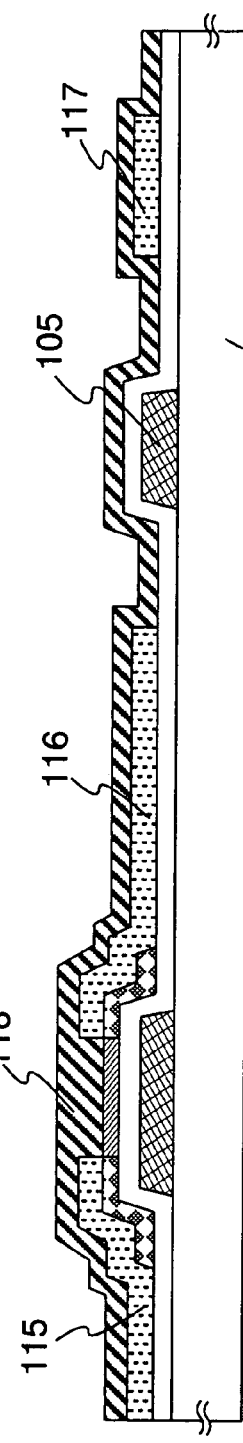
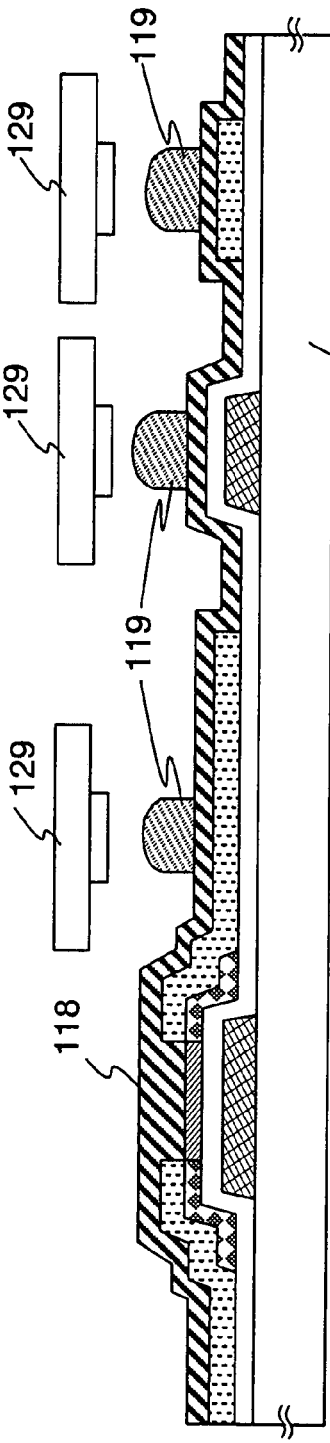

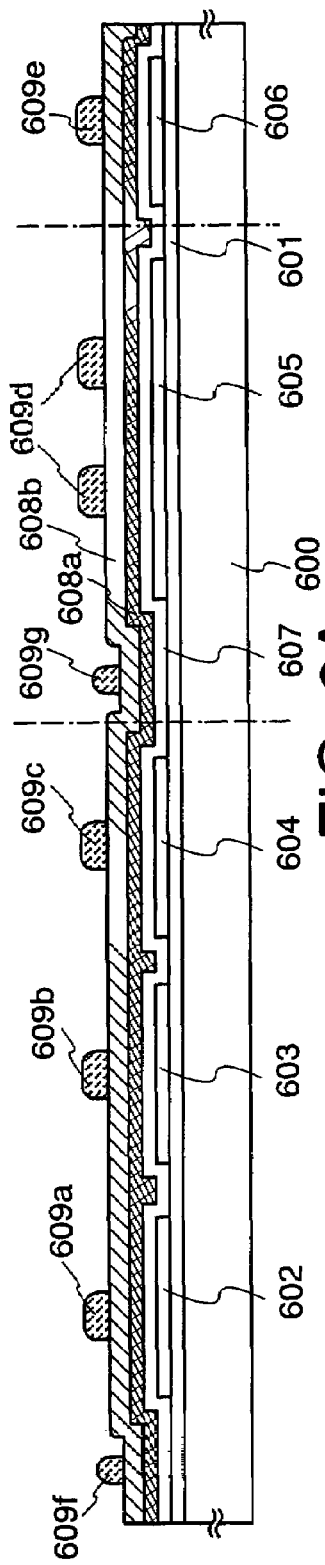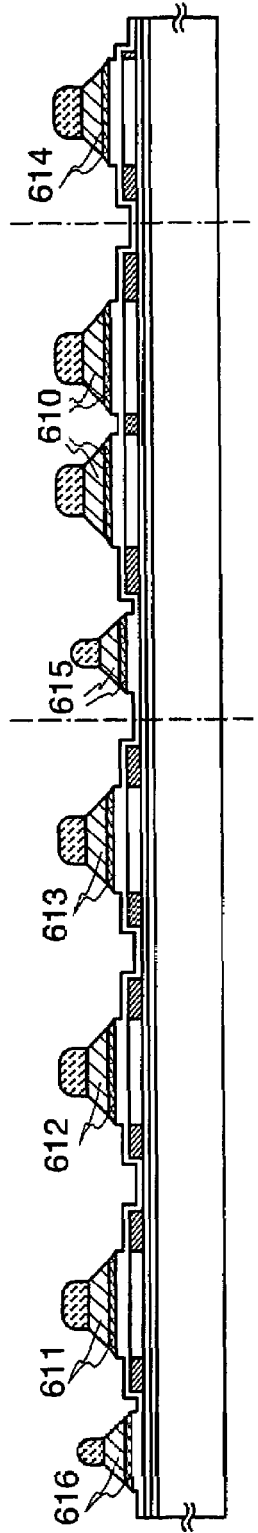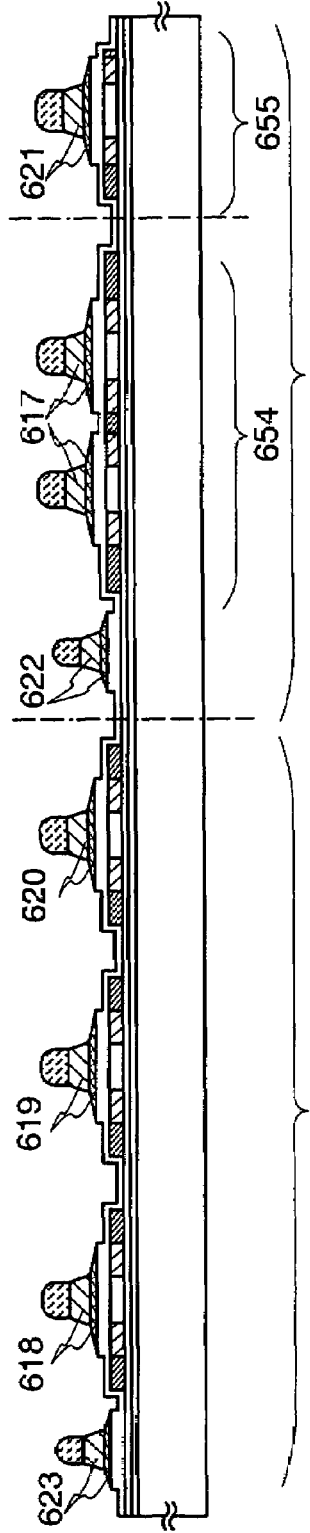

FABRICATION METHOD OF A SEMICONDUCTOR DEVICE USING LIQUID REPELLENT FILM

BACKGROUND OF THE INVENTION

1. Field of the Invention

The invention relates to a fabrication method of a semiconductor device using a droplet discharge method typified by ink-jet method. The invention particularly relates to a technology for forming a contact hole provided in a semiconductor device.

2. Description of the Related Art

With respect to the fabrication of a semiconductor device, the use of a droplet discharge system is considered to form a thin film or a pattern of a wiring in view of the cost reduction of facilities and simplification of the process.

The following method has been taken in forming a contact hole in a semiconductor device. First, photolithography is performed as a resist is applied entirely over a substrate and prebaked; ultraviolet radiation is applied through a mask; and the substrate is exposed thereafter to form a resist pattern. Subsequently, parts of an insulating film, a semiconductor film, a conductive film, and the like, which exist the portion to be contact holes are etched away using the resist pattern as a mask, thereby forming contact holes. (Japanese Laid-Open Patent Application No. 2000-89213)

However, when a contact hole is formed using the conventional process of the semiconductor device fabrication, the resist is formed almost entirely over the substrate in order to apply the resist over the film where the contact hole is not formed. Accordingly, the throughput of the resist is considerably low. Further, even though the throughput is improved, the resist spreads to the area of a contact hole when the surface state of the base and the amount of the resist to be applied are not fully controlled; thus, the contact defect would occur.

BRIEF SUMMARY OF THE INVENTION

The present invention has been made in view of the above problems and it is an object of the present invention to propose a method for forming a good contact hole and insulating films provided over the contact hole, such as an interlayer insulating film, a planarizing film, a gate insulating film, and the like. It is a further object of the present invention to provide a method for fabricating a semiconductor device with high yield and high throughput at low cost.

According to the invention, a first organic film that is liquid repellent (hereinafter referred to as a first organic film) is selectively formed on a film forming a semiconductor device, where a contact hole of the semiconductor device is to be provided. A second organic film is formed on a part of the film where the first organic film is not formed, and the first organic film is removed thereafter; thus, a contact hole is formed on the part where the first organic film has been formed.

First, the first organic film that is liquid repellent (water repellent, oil repellent) is formed on the area over the film forming a semiconductor device where a contact hole is to be provided. The first organic film may be formed by a droplet discharge method typified by ink-jet method; however, the formation method is not limited thereto as long as it is possible to form the first organic film selectively.

The film on which the first organic film is provided includes a semiconductor film, a conductive film, an insulating film, or the like. Here, a semiconductor film typically includes, but not limited to films each forming a source region, a drain region, and a channel region. Further, the conductive film typically includes, but not limited to films forming a gate electrode, a source electrode, a drain electrode, and a wiring such as a scan line, a signal line, or the like in the semiconductor device. An insulating film typically includes, but not limited to a gate insulating film, an interlayer insulating film, a planarization film, or the like.

Next, a second organic film is formed on an area of the film where the first second organic film is not formed. The second organic film is formed over the substrate by spin coating or a droplet discharge method. Here, the first organic film is repellent to the second organic film; thus, the second organic film is not formed on the first organic film. The second organic film serves as an interlayer insulating film, a planarizing film, a gate insulating film, or the like in the semiconductor device.

Subsequently, the first organic film is removed and a contact hole is formed on the area where the first organic film has been formed. The first organic film may be removed by dry etching, wet etching, etching using atmospheric plasma, water washing, or a treatment using a laser or an electron beam. Solution, solvent, or gas used for etching (etchant) or a laser may be appropriately selected in accordance with the material of the first organic film.

Note that, in the case where the first organic film is not intrinsically liquid repellent, the first organic film is treated with plasma, a laser, an electron beam, or the like before forming the second organic film. The surface of the first organic film can be made liquid repellent by the treatment, and the second organic film can be prevented from adhering to the first organic film. Thus, a good contact hole can be made. Naturally, when the first organic film is made of a material that is liquid repellent, such treatment can be omitted, or can be performed in order to improve the liquid repellency.

Note that, in this specification, "a first organic film" includes an organic film whose repellency is improved or which is made liquid repellent by a predetermined treatment although the organic film is not intrinsically liquid repellent or not repellent enough.

Further, a conductive film is formed on the second organic film and in the contact hole; thus, the conductive film can be electrically connected to an element of such as a TFT through the contact hole. The conductive film may be formed by a droplet discharge method using a paste containing a conductive material or by sputtering using a target containing a conductive material. The conductive material may be typically selected from metals such as Ag, Au, Cu, Ni, Pt, Pd, Ir, Rh, W, Al, Ta, Mo, Cd, Zn, Fe, Ti, Si, Ge, Zr, and Ba; silver halide particles; dispersed nanoparticles; indium tin oxide (ITO) used as a transparent conductive film; zinc oxide (ZnO), zinc oxide added with gallium (GZO); indium zinc oxide (IZO) in which 2% to 20% of zinc oxide is mixed into indium oxide; organic indium; organotin; titanium nitride; and the like. Silicon (Si) or silicon oxide (SiOx) may be contained in the paste or the target for sputtering as especially to a material used for a transparent conductive film. For example, a conductive material in which silicon oxide is contained in ITO (generally referred to as ITO-SiOx; however, hereinafter also referred to as ITSO for convenience) may be used. Further, layers of those materials may be stacked to form a desired conductive film.

Further, a display device controlled with a TFT by providing a light emitting element including a layer containing an organic or inorganic compound. Such a display device is called an active matrix display device.

As in the invention, a liquid repellent material is used for the first organic film (a film provided at a part to be a contact hole), so that the second organic film serving as an interlayer insulating film, a planarizing film, a gate insulating film, or the like may be formed at the predetermined portion. Besides, the insulating films can be formed in and around the contact hole without performing exposure or development using a resist mask; thus, the process can be significantly simplified as compared with conventional process. Further, the second organic film is not formed on the first organic film, so that the first organic film can be removed more easily and a good contact hole can be formed through a simple process.

Even in the case of using a material which is not liquid repellent for the first organic film, the first organic film may be made repellent by liquid repellent treatment with plasma, a laser, an electron beam, or the like before forming the second organic film. Thus, wider options of materials can be offered. Further, in the case of using a material which is intrinsically liquid repellent, the repellency can be improved by the treatment.

In forming the first organic film, a conductive film, and the like, liquid containing the material of the films can be applied to an arbitrary area by changing the relative positions of the substrate and a nozzle from which the liquid is discharged by a droplet discharge method. Further, the thickness or the width of the patterns to be formed can be controlled by the nozzle diameter, the liquid discharge rate, and relative relationship among the movement speeds of the nozzle and the substrate where the discharged material is applied. Thus, the material of the films can be accurately discharged and the films can be formed in the desired area. Since a patterning process, that is exposure and development using a resist mask, can be omitted, significant simplification of the process and the cost reduction can be attempted. Further, by using the droplet discharge method, patterns can be formed on an arbitrary area and the thickness and the width of the patterns to be formed can be controlled. Thus, even a large semiconductor element substrate having a side of 1 m to 2 m can be fabricated with high yield at low cost.

As described above, a contact hole of a semiconductor device and an insulating film therearound can be formed accurately through a simple process. Further, a method for fabricating a semiconductor device with high throughput and high yield at low cost.

BRIEF DESCRIPTION OF THE DRAWING

FIGS. 1A to 1C are figures describing a fabrication method of an inverted staggered TFT.

FIGS. 2A to 2C are figures describing a fabrication method of an inverted staggered TFT.

FIGS. 6A to 6C are figures describing a fabrication method of an active matrix substrate.

DETAILED DESCRIPTION OF THE INVENTION

Embodiment Mode 1

Figure 3A:
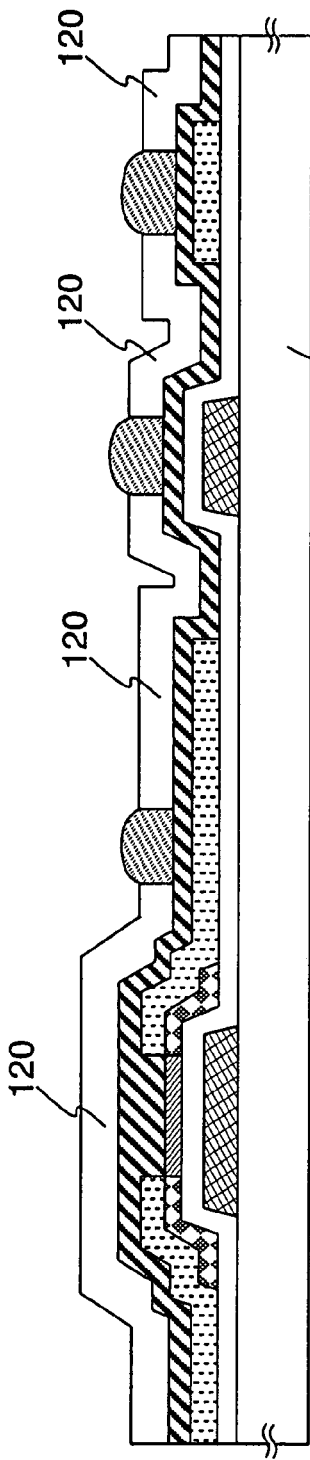
FIGS. 3A to 3C are figures describing a fabrication method of an inverted staggered TFT.

In this embodiment mode, the case of applying the present invention to the fabrication of an inverted staggered (bottom gate type) TFT will be described with reference to FIGS. 1A to 3C.

First, a gate electrode 104 and a scan line 105 supplying a signal to the gate electrode 104 is formed over the substrate 100. It is preferable that the gate electrode 104 and the scan line 105 are formed over the substrate 100 by selectively discharging each composition containing a conductive material. In this case, etching using a mask pattern is not required, so that the number of the fabrication process can be significantly simplified.

The diameter of nozzles 102 used as a liquid discharge means is each set at 0.1 μm to 50 μm (preferably, 0.6 μm to 26 μm), and the discharge amount of the composition discharged from the nozzles 102 is each set at 0.00001 pl to 50 pl (preferably, 0.0001 pl to 10 pl). The discharge amount increases in proportion with the diameters of the nozzles 102. Further, distance between the object and the nozzle discharge port should be made short as possible, and should be preferably reduced to 0.1 mm to 2 mm to apply the discharged composition on the desired area.

The composition discharged from each discharge port uses a material in which a conductor is dissolved or dispersed in a solvent. Metal such as Ag, Au, Cu, Cr, Ni, Pt, Pd, Ir, Rh, W, Al, Ta, Mo, Cd, Zn, Fe, Ti, Si, Ge, Zr, or Ba, silver halide particles, dispersed nanoparticles, or the like can be used. Further, ITO, ITSO, organic indium, organotin, zinc oxide (ZnO), titanium nitride (TiN), or the like may be used as a transparent conductive film. Note that, the gate electrode 104 and the scan line 105 may be formed of stacked conductive films containing the above materials.

The composition discharged from each discharge port is preferably a solution in which gold, silver, or copper is dissolved or dispersed in a solvent considering the resistivity. More preferably, silver or copper which has low resistance may be used. Note that, in the case of using copper, it is preferable to provide a barrier film for preventing impurities from mixing in. The solvent may use esters such as butyl acetate or ethyl acetate, alcohols such as isopropanol or ethyl alcohol, or an organic solvent such as methyl ethyl ketone or acetone.

As a barrier film used in the case of using copper for a wiring, an insulating or conductive material containing nitrogen such as silicon nitride, silicon oxynitride, aluminum nitride, titanium nitride, or tantalum nitride (TaN), and the material may be applied by a droplet discharge method.

The viscosity of a composition used in the droplet discharge method is preferably 300 mPa·s or less for preventing desiccation and allowing the composition to be discharged smoothly from each discharge port. The viscosity of each composition, the surface tension, or the like may be set appropriately in accordance with the solvent or the usage. For example, the viscosity of the composition in which ITO, ITSO, organic indium, or organotin is dissolved or dispersed in a solvent is 5 mPa·s to 50 mPa·s; the viscosity of the composition in which silver is dissolved or dispersed in a solvent is 5 mPa·s to 2 mPa·s; and the viscosity of the composition in which gold is dissolved or dispersed in a solvent is 10 mPa·s to 20 mPa·s.

It is preferable that the diameter of the conductor particles is small as possible, preferably, a particle size of 0.1 μm or less, depending on the diameter of each nozzle or the desirable pattern shape, in order to prevent each nozzle from clogging or to make fine patterns. Each composition may be formed by a known method such as a electrolytic method, an atomization method or wet reduction, and the particle size is generally about 0.5 μm to 10 μm. Note that, in the case of forming the composition by gas evaporation method, the nanoparticles protected with a dispersant are fine as about 7 nm, and the nanoparticles are dispersed stably at room temperature and behave similarly to liquid without aggregation in the solution when they are each protected with a coating. Therefore, it is preferable to use a coating.

The gate electrode 104 and the scan line 105 may be formed by etching a conductive film previously formed over the entire substrate using a mask pattern. In this occasion, the mask pattern may be formed by exposure and development in a conventional manner; however, it is desirable to form the mask pattern by a droplet discharge method in view of simplification of the process. The mask pattern may be formed by selectively discharging a composition containing an organic material such as acrylic, benzocyclobutene, polyamide, polyimide, benzimidazole or polyvinyl alcohol over the conductive film from the discharge nozzle 102. A pattern can be formed only in the desired area with a discharge method by which the composition is selectively discharged.

Even a composition containing a photosensitive agent may be used for a material of the mask pattern. For example, a composition in which a novolac resin which is a positive resist and a naphtho quinonedi azide compound which is a photosensitive agent; a base resin which is a negative resist, diphenylsilane diol, and an acid generator; or the like are dissolved or dispersed in a known solvent may be used. In addition, a material in which a skeletal structure is composed of a bond of silicon (Si) and oxygen (O) and at least contains hydrogen as a substituent, or further contains at least one of fluorine, an alkyl group, and aromatic hydrocarbons as a substituent in addition to hydrogen (typically, siloxane resin) may be used. It is desirable that the mask pattern is baked and cured before etching the conductive film.

In the case where the gate electrode 104 and the scan line 105 are formed by etching, the step coverage is preferably improved by tapering the gate electrode 104 and the scan line 105 in order to avoid electrical connection with a semiconductor film 107 to be formed later. The mask pattern is removed after the etching.

A glass substrate, a quartz substrate, a substrate made of an insulating material such as alumina, a heat resistant plastic substrate which can endure the processing temperature of the post process, or the like can be used as the substrate 100. In this case, it is desirable to form an insulating film of silicon oxide (SiOx), silicon nitride (SiNx), silicon oxynitride (SiOxNy) (x>y), silicon nitride oxide (SiNxOy) (x>y) (x, y=1, 2 . . . ), or the like in order to prevent penetration of impurities or the like through the substrate. Further, a substrate made of metal such as stainless steel or a semiconductor substrate whose surface is provided with an insulating film of such as silicon oxide or silicon nitride may be used. (FIG. 1A)

A gate insulating film 106 is formed over the gate electrode 104 and the scan line 105. It is preferable that the gate insulating film be formed with an insulating film containing silicon, such as silicon nitride, silicon oxide, by a film formation method such as plasma CVD or sputtering.

The semiconductor film 107 is formed over the gate insulating film 106. The semiconductor film 107 may be an amorphous semiconductor, a crystalline semiconductor, or a semi-amorphous semiconductor (SAS). A semiconductor film may contain silicon, silicon germanium (SiGe), or the like as a main component. The semiconductor film 107 can be formed by plasma CVD or the like. Further, the semiconductor film 107 has a thickness of 10 nm to 60 nm preferably.

A first mask pattern 108 is formed over the semiconductor film 107 by a droplet discharge method. The mask pattern 108 is preferably formed with a resist or a heat resistant high molecular weight material. It is preferable to use a high molecular weight material containing high polarity heteroatoms with less aliphatic part and further contains an aromatic ring and a heterocyclic ring as a principal chain. Polyimide and polybenzimidazole can be given as typical examples of such a high molecular weight material. In the case of using polyimide, a composition containing polyimide is discharged from the nozzle 127 and applied onto the semiconductor film 107 and baked at 200° C. for 30 minutes; thus, the mask pattern 108 is formed (FIG. 1B).

Next, the semiconductor film 107 is etched with the use of the mask pattern 108 to form a semiconductor island film 109. A chlorine-based gas typified by $Cl_2$, $BCl_3$, $SiCl_4$ or $CCl_4$; a fluorine-based gas typified by $CF_4$, $SF_6$, $NF_3$, or $CHF_3$; or $O_2$ may be used as the etching gas. The mask pattern 108 is removed after the etching.

A mask pattern 110 is formed in contact with the semiconductor island film 109 overlapping the gate electrode 104. The mask pattern 110 can be formed directly on the semiconductor island film 109 by a droplet discharge method using a nozzle 128. A material of the liquid composition is selected from acrylic, benzocyclobutene, polyamide, a polyimide, benzimidazole, polyvinyl alcohol and so on which can form an electrically insulating film. Polyimide is preferably used. Further, the mask pattern 110 serves not only as a mask but also as a channel protective film in doping an impurity element 111 into the semiconductor island film 109. The thickness of the mask pattern 110 may be more than 1 μm, preferably 5 μm or more (FIG. 1C).

Subsequently, an impurity region is formed in a part of the semiconductor island film 109 which is not covered with the mask pattern by doping the impurity element 111 into the semiconductor island film 109. As the impurity element 111, boron providing p-type conductivity, or arsenic or phosphorus providing n-type conductivity may be used. The doping may be performed by ion doping or ion implantation. A channel region 112, and a source region 113 and a drain region 114 which are doped with impurities are formed in the semiconductor island film 109. Further, activation may be performed by heat treatment after the doping (FIG. 2A).

Thereafter, the mask pattern 110 may be peeled or may be left to serve as a part of a passivation film to be formed later.

It is not shown, the mask pattern 110 may remain on the 109, a semiconductor film doped with impurities may be formed and patterned, and thereafter etching may be performed to separate the semiconductor film doped with impurities; thus, the source region 113 and the drain region 114 may be formed. In this case, the mask pattern 110 serves as a channel protective film; thus, in etching a semiconductor film doped with impurities, damage due to over etching or the like of a part of the semiconductor island film 109 to be the channel region can be prevented. Consequently, a channel protective type (channel stopper type) TFT with high mobility and stable characteristics can be obtained. The semiconductor film doped with impurities may be formed by plasma CVD or the like using a gas in which an impurity element such as boron, arsenic, or phosphorus is mixed into a source gas of such as $SiH_4$, $Si_2H_6$, $SiH_2Cl_2$, $SiHCl_3$, $SiCl_4$, or $SiF_4$.

Subsequently, a source electrode 115 and a drain electrode 116 are formed over the source region 113 and the drain region 114, and a source signal line 117 is formed around a TFT element area by applying a conductive material by droplet discharge method. The same material as the material used for the gate electrode 104 and the scan line 105 is dissolved or dispersed into a solvent for the conductive material. For example, a composition containing Ag (hereinafter referred to as Ag paste) is selectively discharged and baked by heat treatment to form an electrode with a thickness of 600 nm to 800 nm.

Note that, if the bake is performed in $O_2$ atmosphere, an organic material such as a binder (a thermosetting resin) or the like contained in the Ag paste is decomposed, and a Ag film containing hardly any organic material can be obtained. A solvent in the Ag paste is volatilized by discharging the paste under reduced pressure. Consequently, heat treatment thereafter can be omitted, or the time for the heat treatment can be reduced.

A conductive film is previously formed by sputtering or the like, a mask pattern is formed by a droplet discharge method, and thereafter etching the conductive film; thus, the source electrode 115 and the drain electrode 116 are formed. The mask pattern can also be formed of the same material as above.

A passivation film 118 is formed over the source electrode 115 and the drain electrode 116. The passivation film 118 is formed of an insulating material such as silicon nitride, silicon oxide, silicon nitride oxide, silicon oxynitride, aluminum oxynitride, aluminum oxide, diamond like carbon (DLC), or nitrogen contentaining carbon (CN) by a film formation method such as plasma CVD or sputtering. The material may be the same as the mask pattern 110. Further, the above materials may be stacked to form the passivation film 118. It is desirable to form the passivation film 118 as possible since the passivation film has a function of preventing the diffusion of impurities from above the TFT or the like (FIG. 2B).

Next, first organic films 119 that are liquid repellent are selectively formed by a droplet discharge method at portions over the passivation film 118 where contact holes used for electrical connection with the source electrode 115 and the drain electrode 116 of the TFT, the scan line 105, and the source signal line 117 are to be formed.

A silane coupling agent, which is highly liquid repellent, of the chemical formula $R_n$—Si—$X_{4-n}$ (n=1, 2, 3) can be used for the first organic film 119. Preferably, fluoroalkyl silane (FAS) which is a fluorine-based silane coupling agent is used.

Here, R denotes a substance which contains a relatively inert group such as an alkyl group or a reactive group such as a vinyl group, an amino group, or an epoxy group. Further, X is formed with halogen, a methoxy group, an ethoxy group, or a hydroxyl group of the substrate surface such as an acetoxy group; or a hydrolysate group that is bondable with absorbed water by condensation. R in FAS has a structure expressed by $(CF_3)(CF_2)_x(CH_2)_y$ (x is an integer in the range of 0 to 10, and y is an integer in the range of 0 to 4). When a plurality of Rs or Xs are bound to Si, the Rs or Xs may be the same or different from each other.

Especially in the case of using a fluorine-based silane coupling agent such as FAS for the first organic films, the film thickness is very thin since the organic film is a monomolecular film. In this specification, the thickness is shown in an exaggerated form. Accordingly, there may be a case where the film thickness is thinner than the second organic film. The same situation occurs even another material such as PVA is used as a material for the first organic films.

The first organic films 119 are formed as follows. Here the case of using a silane coupling agent will be described. First, a silane coupling agent is selectively applied over the area where the first organic films are to be formed, by spin coating or the like. Next, the silane coupling agent is dessicated by being left under room temperature, and water washing is performed as necessary. Finally, the silane coupling agent is baked, so that siloxane network (a structure in which a skeletal structure is composed of a bond of Si and O, which contains hydrogen as a substituent or further contains at least one of fluorine, an alkyl group, and an aromatic hydrocarbon in addition to hydrogen) including a $CF_2$ chain and a $CF_3$ chain is created. The desiccation or water washing can be omitted. $CF_2$ and $CF_3$ can make the film whose surface is treated with the silane coupling agent be repellent.

The silane coupling agent is a silicon compound represented by $R_n$—Si—$X_{4-n}$ (n=1, 2, 3). Here, R denotes a substance which contains a relatively inert group such as an alkyl group or a reactive group such as a vinyl group, an amino group, or an epoxy group. Further, X is formed with halogen, a methoxy group, an ethoxy group, or a hydroxyl group of the substrate surface such as an acetoxy group; or a hydrolysate group that is bondable with absorbed water by condensation. In particular, when R is an inert group such as an alkyl group, the film surface is provided with characteristics such as water repellency, resistance against adhesion and friction, lubricity, luster, or the like. For example, if n=1, the silicon compound is used as a coupling agent; if n=2, the silicon compound is used as a material of a siloxane polymer; if n=3, the silicon compound is used as a silylating agent or a blocking agent of a polymer (an end cap agent for terminating each end of a polymer.)

A fluoroalkoxy silane coupling agent is given as a typical example of the silane coupling agent. For example, $CF_3(CF_2)_k$ $CH_2CH_2Si(OCH3)_3$, $(CF_3(CF_2)_kCH_2CH_2SiCH_3(OCH_3)_2$, $CF_3(CF_2)_kCH_2CH_2Si(OCH_2CH_3)_3$ (k=3, 5, 7, 9); $(CF_3)_2CF(CF_2)_mCH_2CH_2Si(OCH_3)_3$, $(CF_3)_2CF(CF_2)_mCH_2CH_2SiCH_3(OCH_3)_2$ (m=4, 6, 8); and $CF_3(CF_2)_j(C_6H_4)C_2H_4Si(OCH_3)_3$, $CF_3(CF_2)_j(C_6H_4)C_2H_4SiCH_3(OCH_3)$ (j=0, 3, 5, 7) are given.

Figure 17:
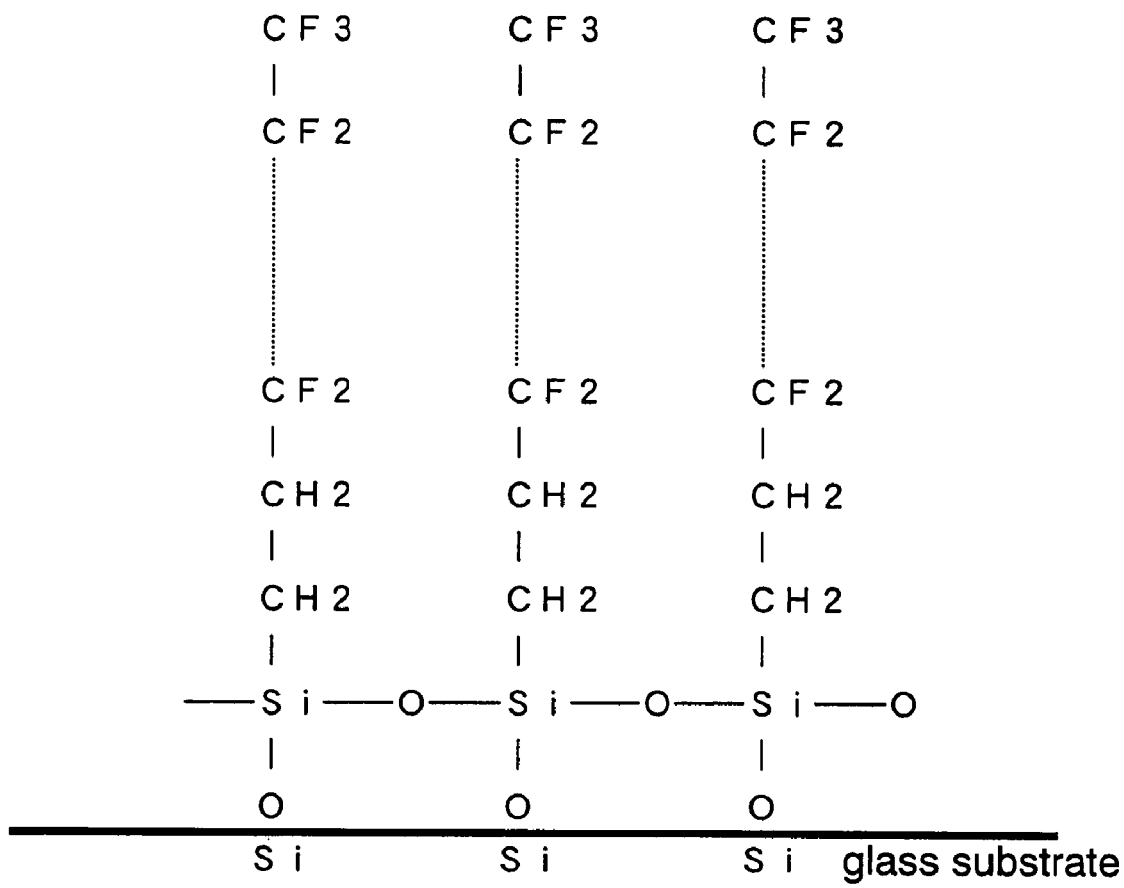
FIG. 17 is a figure showing an outer structure of reformed glass with the use of a silane coupling agent.

A structure of the glass surface in the case of performing surface improvement of glass which is an insulator using $CF_3(CF_2)_kCH_2CH_2Si(OCH_3)_3$ is shown in FIG. 17. The contact angle with liquid (for example, water) adhered onto the glass is increased in the order of $CF<CF_2<CF_3$. Further, the contact angle tends to be larger as the chain of fluorocarbon is longer.

Materials disclosed in Japanese Laid-Open Patent Application No. 2003-80694 can be used as the FAS.

As a fluorine-based resin which is liquid repellent other than FAS, polytetra-fluoroethylene (PTFE), perfluoroalkoxy alkane (PFA), polytetrafluorethylene-perfluoro-propylene copolymer (PFEP), ethylene-tetrafluoroethylene copolymer (ETFE), polyvinylidene fluoride (PVDF), polychloro-trifluoroethylene (PCTFE), ethylene-chlorotrifluoroethylene copolymer (ECTFE), polytetra-fluoroethylene-parfluoro dioxole copolymer (TFE/PDD), polyvinyl fluoride (PVF), or the like can be used.

An organic material which is not intrinsically liquid repellent may also be used for the first organic films 119. In this case, the organic material should be treated with $CF_4$ plasma or the like to obtain liquid repellency. For example, a material in which a water soluble resin such as polyvinyl alcohol (PVA) is mixed into a solvent of $H_2O$ or the like may be used after the plasma treatment. Further, PVA and another water soluble resin may be used in combination. Note that even in the case where the first organic films 119 are liquid repellent, the repellency can be further improved by performing the plasma treatment or the like. (FIG. 2C)

Next, the second organic film 120 is formed at portions where the first organic films 119 are not formed. The second organic film 120 may use an insulating film containing a bond of Si—O and a bond of Si—$CH_x$, which is formed from polyimide resin, acrylic resin, polyamide resin, or a siloxane material by spin coating, a droplet discharge method, or the like.

Figure 9A:
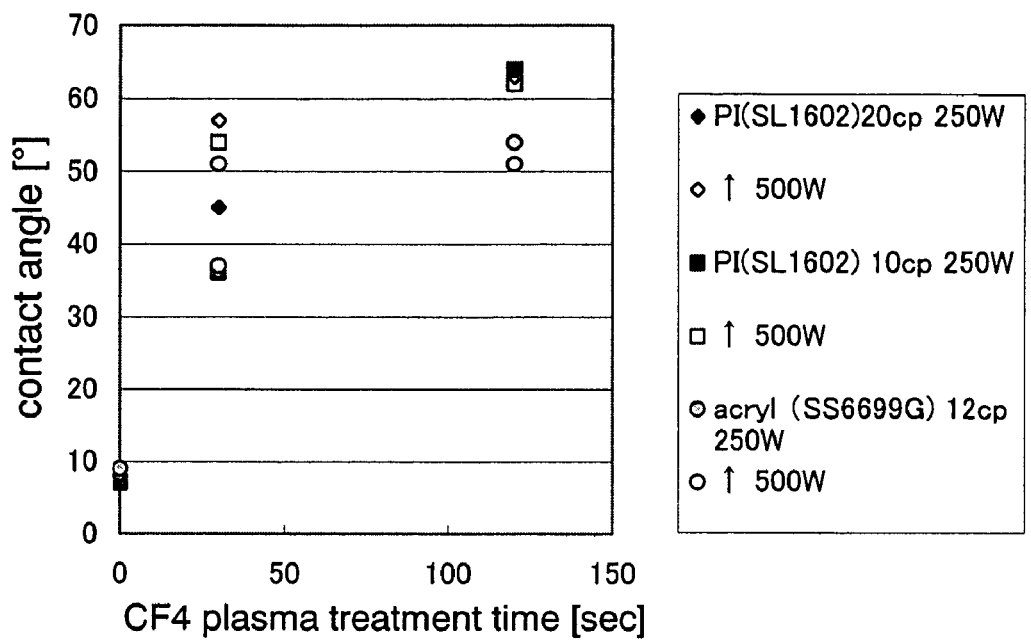
FIGS. 9A and 9B are graphs evaluating the contact angle of a first organic film and a second organic film.
Figure 9B:
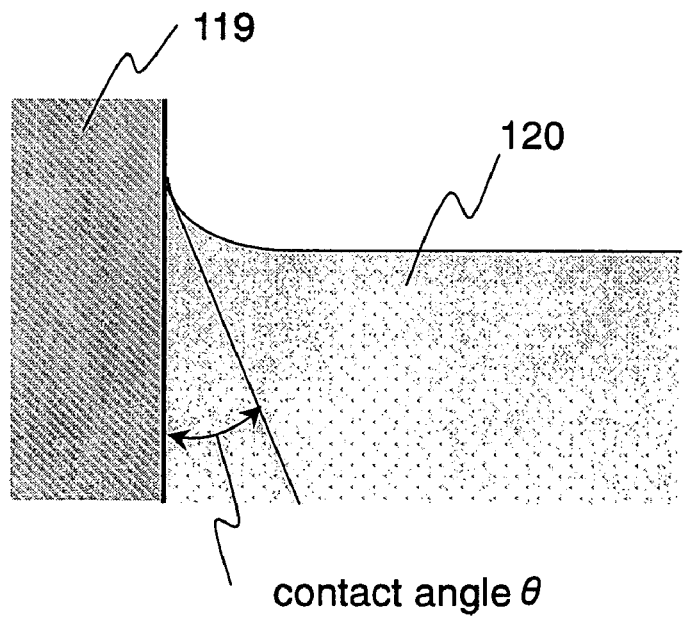

Here, an enlarged view of a state where the second organic film 120 is formed is shown in FIG. 9B. In FIG. 9B, a contact angle θ is defined as an angle formed by a liquid surface and a solid surface in the area where the free surface of stationary liquid touches a solid surface The contact angle depends on the magnitude relationship between cohesion of liquid molecules and adherence between the liquid and the solid surface. The contact angle is acute when the liquid wets the solid (when the adherence is strong), and the contact angle is obtuse when the liquid does not wet the solid. In other words, as the contact angle is larger, the adherence is weaker; namely, the liquid repellency is increased.

The result of evaluating the contact angles in the case of using PVA for the first organic film and using polyimide and acrylic for the second organic film is shown in FIG. 9A. First, PVA is applied over the substrate, $CF_4$ plasma treatment is performed, and a polyimide solution (SL 1602 made by Toray) and acrylic solution (SS6699G made by JSR) are applied and the contact angles are evaluated. The condition of $CF_4$ plasma treatment is set at a power of 250 W or 500 W and a pressure of 0.5 Torr.

As shown in a graph of FIG. 9A, in the case of polyimide (20 cp; unit of the viscosity "cp" is equivalent to "mPa·s"), the contact angle is increased from 8° to 45°; in the case of polyimide (10 cp), the contact angle is increased from 8° to 36°; and in the case of acrylic, the contact angle is increased from 9° to 37° due to the $CF_4$ plasma treatment of 250 W for 30 sec. As above, the contact angle is increased by 4 times to 6 times.

When the power the $CF_4$ plasma treatment is set high as 500 W, the contact angle is 57° in the case of polyimide (20 cp), the contact angle is 54° in the case of polyimide (10 cp), and the contact angle is 51° in the case of acrylic. Thus, the contact angle is increased by about 1.2 times to 1.5 times as compared to the case of 250 W. Further, when the processing time is increased to 120 sec, the contact angle is about 61° to 65° in the case of polyimide; and the contact angle is about 51° to 54° in the case of acrylic. Thus, a same contact angle is obtained as the processing time is increased regardless of the power. Consequently, by performing $CF_4$ plasma treatment to PVA, the contact angle between the first organic film and the second organic film of such as polyimide or acrylic can be increased; namely, the adherence between the films is weakened and the liquid repellency can be improved.

Regarding this point, the second organic film to serve as an insulating film such as an interlayer film, a planarizing film, a gate insulating film can be well formed using the first organic films which are liquid repellent as masks. Further, a good contact hole can be formed by later removing the first organic films.

In the case where the contact angle between PVA and polyimide or acrylic which forms the second organic film is made more than 35° or more (preferably 45° or more) by plasma treatment to PVA which forms the first organic films; the second organic film which is to serve as an insulating film later is formed using the first organic films as masks. Further, a good contact hole can be formed through the following steps. In other words, the first organic film is regarded as repellent to the second organic film in case the contact angle being more than 3520 (more preferable 45°). The power is set at more than 250 W (preferably 500 W) and the processing time is set for 100 sec or more (preferably 120 sec or more) to increase the contact angle by 50° or more (preferably, 60° or more in the case of polyimide and 50° or more in the case of acrylic); thus, the adherence between the films is weakened and the liquid repellency can be further improved. Accordingly, a more preferable contact hole and an insulating film around the contact hole can be formed.

Such synergism can be obtained even when a material which is intrinsically liquid repellent, for example, fluoroalkyl silane (FAS) which is a fluorine-based resin is used as the first organic films (the best value of the contact angle varies depending on the materials of the first and second organic films), without limitation to the case where $CF_4$ plasma treatment is performed to PVA. In this case, the $CF_4$ plasma treatment can be naturally omitted; however, the treatment may be appropriately applied to further improve the liquid repellency. (FIG. 3A)

After the second organic film 120 is formed, the first organic films 119 are removed. Further, the passivation film 118 is removed in the case the film is provided, and a part of the scan line over the gate insulating film 106 is also removed.

The first organic films 119, the passivation film 118, and the gate insulating film 106 may be removed by wet etching, dry etching, etching using atmospheric plasma discharge, water washing, or a treatment using laser or an electron beam. The removal method may be appropriately selected in accordance with the materials of the first organic films 119, the passivation film 118, and the gate insulating film 106. In particular, in the case where a water soluble resin such as PVA is used, it can be easily removed by water washing. Further, the kind of etching gas, solution (etchant), or laser may be appropriately selected in accordance with the materials. Further, the removal of the first organic film 119, the removal of the passivation film 118, and the removal of the gate insulating film 106 may be performed in different steps.

Figure 3B:
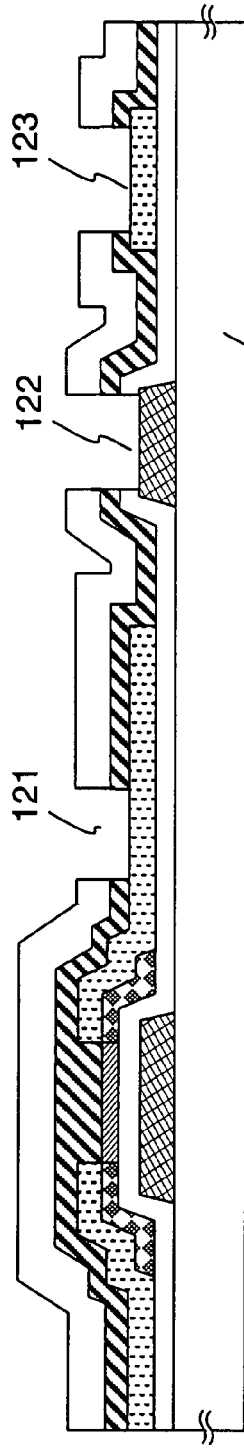
Figure 3C:
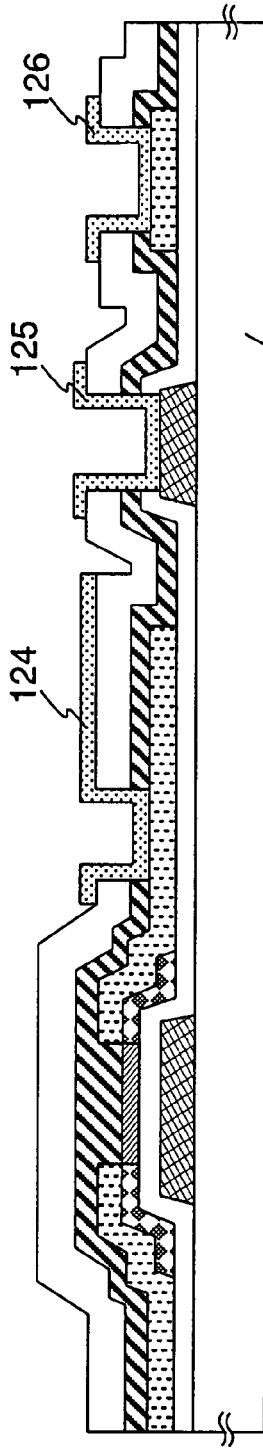

Through the above removal process, contact holes 121 to 123 are formed on the area where the first organic films 119 have been, that is, over the source electrode 115 or the drain electrode 116, the scan line, and the source signal line 117. (FIG. 3B)

The etching condition is preferably set so that the first organic films 119 can be completely removed; however, when the contact holes reach intended films such as the semiconductor film and the conductive film, the first organic films can remain on the side walls of the contact holes. That is because the remaining first organic film can serve well as a part of an interlayer film. In this point, the material of the first organic film can be selected widely. Further, even an insulating material or a conductive film may replace the first organic film if the material is liquid repellent, and can serve as a mask for forming the second organic film 120.

After the contact holes 121 to 123 are formed, conductive films 124 to 126 for connecting to the source electrode 115 or the drain electrode 116, the scan line 105, and the source signal line 117 are formed. Metal such as Ag, Au, Cu, Cr, Ni, Pt, Pd, Ir, Rh, W, Al, Ta, Mo, Cd, Zn, Fe, Ti, Si, Ge, Zr, or Ba, silver halide particles, dispersed nanoparticles, or the like can be used. Alternatively, ITO, ITSO, organic indium, organotin, zinc oxide, titanium nitride, titanium nitride which contains nitrogen by 50% or less in the composition ratio (hereinafter referred to as Ti (N)), or the like may be used as a transparent conductive film. Further, the conductive films 124 to 126 may be formed by stacking conductive layers containing the materials.

The conductive films 124 to 126 may be formed of the conductive material sputtered and shaped by etching after patterning; however, it is preferable to selectively form the conductive films by a droplet discharge method, so that the process can be significantly simplified. In this case, a pasted material in which a conductive material is dissolved or dispersed in a solvent is discharged from the nozzle to form the conductive films.

Next, a liquid crystal element or a light emitting element (typically, a light emitting element using EL: electroluminescence) including a layer containing an organic or inorganic compound is formed above the conductive film 124. Thus, a flat display such as an active matrix liquid crystal display device or an EL device which can be controlled with a semiconductor device fabricated through the above steps.

In the light emitting device, a light emitting layer which is a stack of layers containing organic or inorganic compounds having different hole transporting characteristics is sandwiched between a pair of electrodes, and the light emitting layer is formed so that holes can be injected from an electrode and electrons can be injected from the other electrode. The light emitting device uses a phenomenon in which holes injected from an electrode and electrons injected from the other electrode are recombined and light is produced. The injection characteristics of the holes and the electrons into the light emitting layer depend on the work function (minimum energy required to extract an electron from the surface of metal or a semiconductor) of a material forming an electrode. It is preferable that the electrode where holes are injected have high work function, and the electrode where electrons are injected have low work function.

According to the invention, contact holes and insulating films such as an interlayer film, a planarizing film, and a gate insulating film can be formed finely through a simplified process without being subjected to exposure or development using a resist mask. Therefore, all semiconductor devices used for LSI, CPU, or the like in addition to the above display device can be manufactured with high yield at low cost.

Embodiment Mode 2

In this embodiment mode, the case of applying the invention to the fabrication of a top gate TFT will be described with reference to FIGS. 4A to 5D.

First, a semiconductor film 401 is formed over the substrate 100 having an insulating surface. The substrate 100 may use a substrate formed of an insulating material such as glass, quartz, or alumina; or metal such as stainless steel or a semiconductor substrate whose surface is provided with an insulating film of such as silicon oxide, silicon nitride, or the like. Alternatively, a flexible or nonflexible plastic substrate which is heat resistant so as to endure the highest processing temperature in this process such as a baking temperature of the pattern formed by a droplet discharge method, or a heat treatment temperature of activation of impurities doped into a source and a drain regions of the semiconductor device.

The semiconductor film 401 is formed of an amorphous semiconductor, a crystalline semiconductor, or a semi-amorphous semiconductor (SAS). The semiconductor film 401 formed of each material can use a semiconductor film containing silicon, silicon germanium (SiGe), or the like as the main component. The semiconductor film 401 can be formed by plasma CVD or the like. Further, it is preferable to form the semiconductor film 401 to the film thickness of 10 nm to 60 nm.

It is desirable that the semiconductor film 401 is formed after a base film (not shown) is formed over the substrate 100. The base film can prevent impurities or the like from penetrating from the substrate to the semiconductor film 401. A silicon oxide film, a silicon nitride film, a silicon oxynitride film, a silicon nitride oxide film, or the like may be used for the base film. The base film may have a layered structure with two or more layers without limitation to a single layer structure. Further, the base film can be formed by plasma CVD or the like.

Next, a mask pattern 403 is formed by a droplet discharge method in order to pattern the semiconductor film 401. The mask pattern 403 is formed by discharging a composition containing an organic resin over the semiconductor film 401 from the nozzle 417 so as to directly apply the pattern.

Figure 4A:
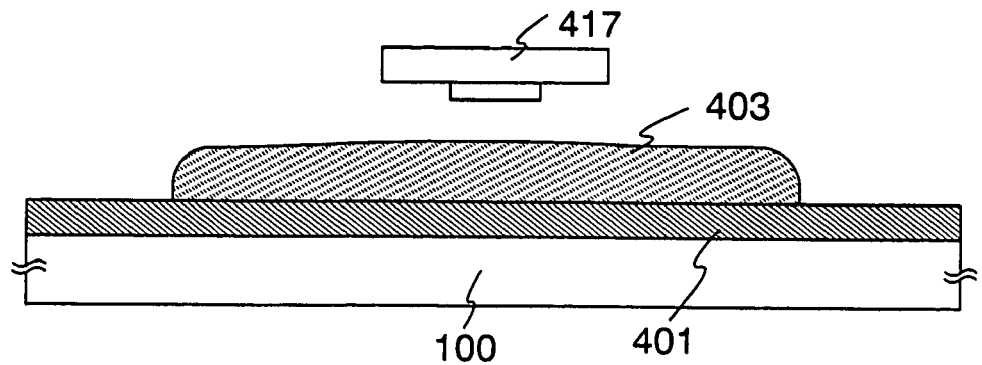
FIGS. 4A to 4D are figures describing a fabrication method of a top gate TFT.

The mask patterns 403 may be consisting of an organic resin such as acrylic, benzocyclobutene, polyamide, or polyimide. Further, a material in which a skeletal structure is composed of a bond of silicon (Si) and oxygen (O) and at least contains hydrogen as a substituent, or further contains at least one of fluorine, an alkyl group, and aromatic hydrocarbons as a substituent in addition to hydrogen (typically, siloxane resin) may be used. Even a composition containing a photosensitive agent may be used for the mask pattern. For example, a composition in which a novolac resin which is a positive resist and a naphtho quinonedi azide compound which is a photosensitive agent; a base resin which is a negative resist, diphenylsilane diol, and an acid generator; or the like is dissolved or dispersed in a known solvent may be used. (FIG. 4A)

A semiconductor island film 404 is formed by etching the semiconductor film 401 using the mask pattern 403. A chlorine-based gas typified by $Cl_2$, $BCl_3$, $SiCl_4$ or $CCl_4$; a fluorine-based gas typified by $CF_4$, $SF_6$, or $NF_3$; or $O_2$ may be used as the etching gas. The mask pattern 403 is removed thereafter.

Figure 4B:
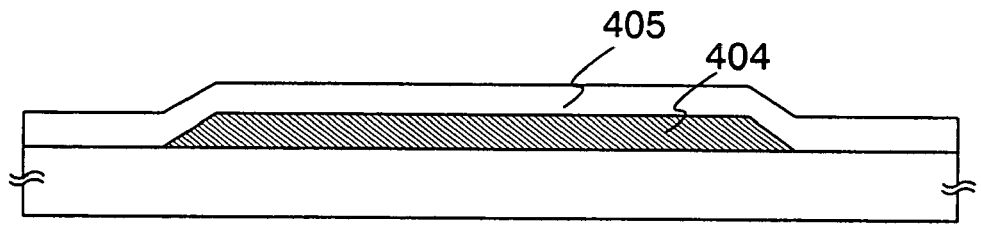

A gate insulating film 405 is formed over the semiconductor island film 404. The gate insulating film 405 is formed with an insulating film containing silicon by plasma CVD or sputtering (FIG. 4B).

Figure 4C:
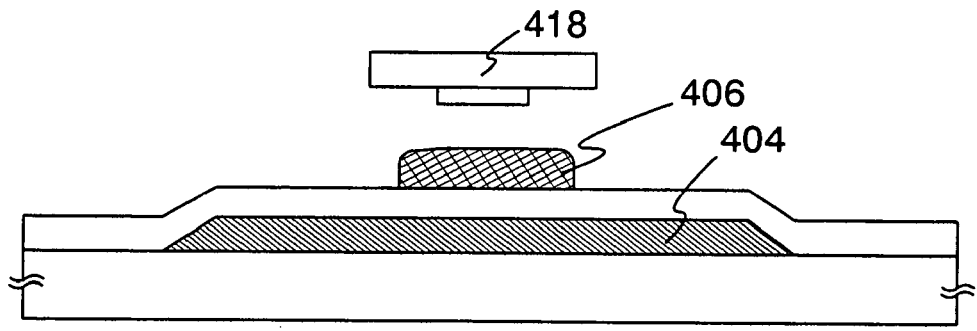

A gate electrode 406 is formed over the gate insulating film 405 by a droplet discharge method. The gate electrode 406 is formed by discharging a composition containing a conductive material from the nozzle 418 so that the gate electrode 406 is formed of the composition directly applied on the gate insulating film 405. The conductive material may use the same material as the gate electrode in Embodiment Mode 1 (FIG. 4C).

Figure 4D:
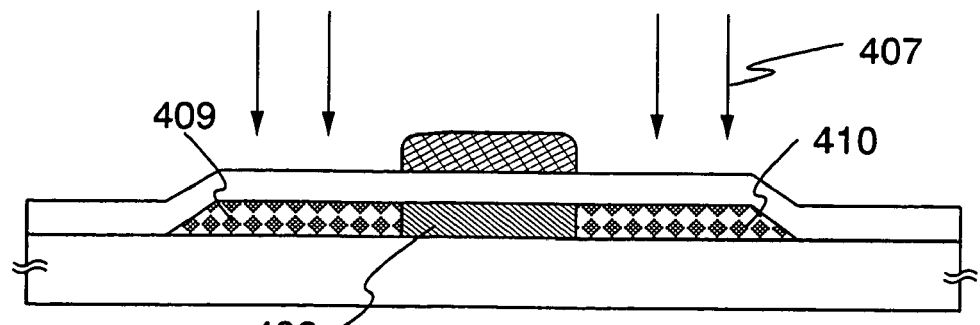

A channel region 408, and a source region 409 and a drain region 410 which are impurity regions are formed by doping an impurity element 407 into the semiconductor island film 404 and the gate electrode 406 as a mask through the gate insulating film 405 (FIG. 4D). Note that activation may be performed by heat treatment after doping.

Next, first organic films 119 which are liquid repellent are selectively formed by a droplet discharge method using a nozzle 419 at portions on the gate insulating film where contact holes are to be formed (the portions where the source electrode and the drain electrode of the TFT are to be formed later).

A fluorine-based resin which is liquid repellent (preferably, fluoroalkyl silane (FAS)) may be used for the first organic films 119 as in Embodiment Mode 1.

An organic material which is less liquid repellent or not liquid repellent may be treated with $CF_4$ plasma or the like to obtain liquid repellency to be used for the first organic films 119. For example, a material in which a water soluble resin such as polyvinyl alcohol (PVA) is mixed into a solvent of $H_2O$ or the like may be used. Further, PVA and another water soluble resin may be used in combination.

Figure 5A:
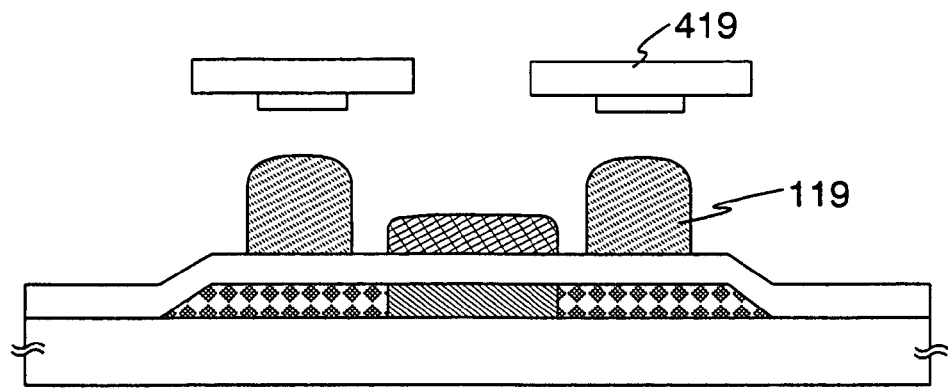
FIGS. 5A to 5D are figures describing a fabrication method of a top gate TFT.
Figure 5B:
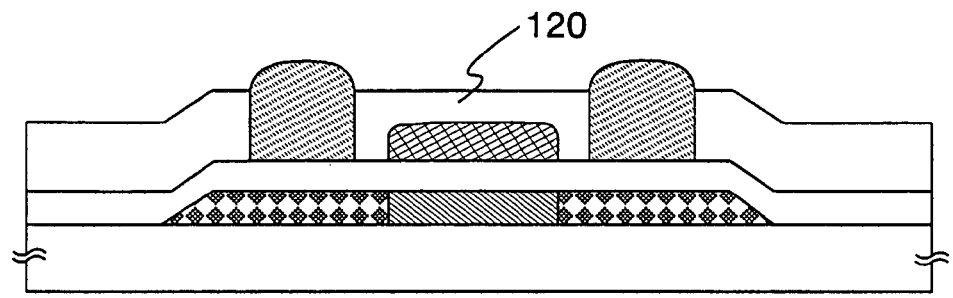

Note that even in the case where the first organic films 119 are liquid repellent, the repellency can be further improved by performing the plasma treatment or the like. (FIG. 5A)

Next, the second organic film 120 is formed at portions where the first organic films 119 are not formed. The second organic film 120 may use an insulating film containing a bond of Si—O and a bond of Si—$CH_x$, which is formed from polyimide resin, acrylic resin, polyamide resin, or a siloxane material by spin coating, a droplet discharge method, or the like.

The first organic films 119 and the gate insulating film 405 are removed after the second organic film 120 is formed. The first organic film 119 and the gate insulating film 405 may be removed by etching such as wet etching, dry etching, or etching using atmospheric plasma discharge; or water washing, or a treatment using laser or an electron beam. The removal method may be appropriately selected in accordance with the materials of the first organic films 119 and the gate insulating film 405. Further, the etching gas, solution (etchant) or laser may be appropriately selected in accordance with the material. Further, the removal of the first organic films 119 and the removal of the gate insulating film 106 may be performed in different steps.

Figure 5C:
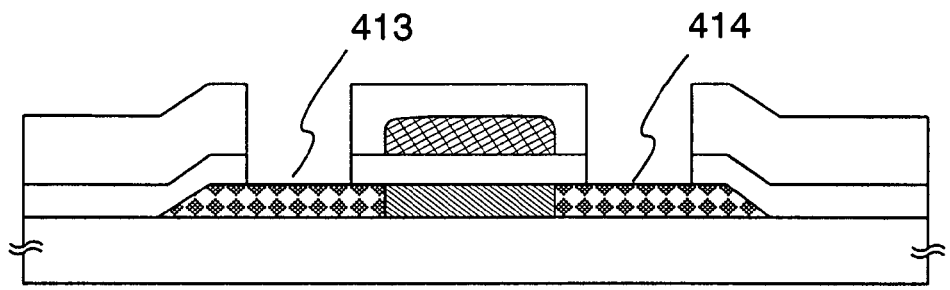

Through the above removal process, contact holes 413 to 414 are formed on the area where the first organic films 119 have been, that is, over the source electrode 409 and the drain electrode 410. (FIG. 5C)

The etching condition is preferably set so that the first organic films 119 can be completely removed; however, when the contact holes reach intended films such as the semiconductor film and the conductive film, the first organic film can remain on the side walls of the contact holes. That is because the remaining first organic film can serve well as a part of an interlayer film. In this point, the material of the first organic film can be selected widely. Further, even an insulating material or a conductive film may replace the first organic films if the material is liquid repellent, and can serve as a mask for forming the second organic film 120.

After the contact holes 413 and 414 are formed, the source electrode 415 and the drain electrode 416 are formed of conductive films to respectively connect to the source region 409 and the drain region 410. The electrode may be formed of the conductive material by sputtering and etching after patterning; however, it is preferable to selectively form the conductive films by a droplet discharge method, so that the process can be significantly simplified. In this case, a pasted material in which a conductive material is dissolved or dispersed in a solvent is discharged from the nozzle 420 to form the wiring. The material discharged from the discharge port may be a solution in which a conductive material is dissolved or dispersed in a solution. Metal such as Ag, Au, Cu, Cr, Ni, Pt, Pd, Ir, Rh, W, Al, Ta, Mo, Cd, Zn, Fe, Ti, Si, Ge, Zr, or Ba, silver halide particles, dispersed nanoparticles, or the like can be used. Alternatively, ITO, ITSO, organic indium, organotin, zinc oxide (ZnO), titanium nitride (TiN), or the like may be used for the conductive material. Further, ITO, ITSO, organic indium, organotin, zinc oxide, titanium nitride, titanium nitride which contains nitrogen by 50% or less in the composition ratio (Ti(N)), or the like may be used as a transparent conductive film. Further, the electrode may be formed by stacking conductive layers containing the materials.

Figure 5D:
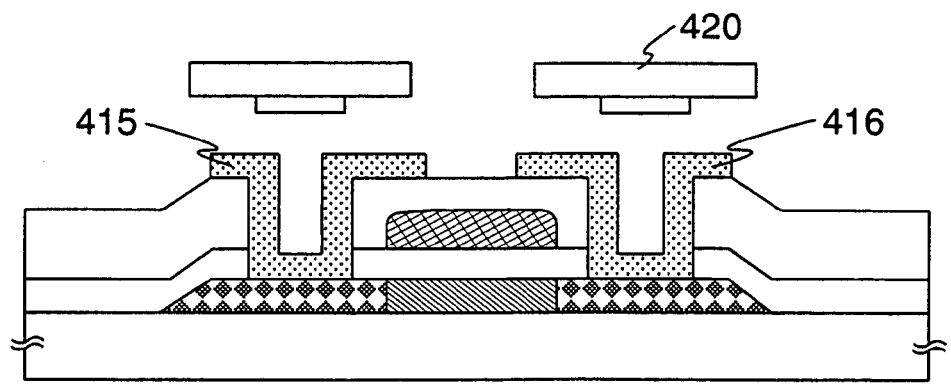

The composition discharged from the discharge port is preferably a solution in which gold, silver, or copper is dissolved or dispersed in a solvent considering the resistivity. More preferably, silver or copper which has low resistance may be used. Note that, in the case of using copper, it is preferable to provide a barrier film for preventing impurities from mixing in. The solvent may use esters such as butyl acetate or ethyl acetate, alcohols such as isopropanol or ethyl alcohol, or an organic solvent such as methyl ethyl ketone or acetone. As a barrier film used in the case of using copper for a wiring, an insulating or conductive material containing nitrogen such as silicon nitride, silicon oxynitride, aluminum nitride, titanium nitride, or tantalum nitride, and the material may be applied by a droplet discharge method. (FIG. 5D)

Through the above steps, a top gate TFT can be fabricated. Further, the TFT is connected to a pixel electrode, and a liquid crystal element or a light emitting element (typically, an EL element) including a layer containing an organic or inorganic compound is formed over the pixel electrode. Thus, a flat display such as an active matrix liquid crystal display device or an EL device which can be controlled with the TFT can be obtained.

In this embodiment mode, the invention is applied to the steps for forming the contact holes at portions where the source electrode 415 and the drain electrode 416 are formed. Naturally, the invention can also be applied to the formation of a contact hole at a portion where the pixel electrode connected to the TFT, which is obtained through the above step, is to be formed; the formation of a contact hole in the area where the wiring connecting to the gate electrode 406 is formed; or the like.

According to the invention, contact holes can be formed finely through a simplified process without being subjected to exposure or development using a resist mask. Therefore, all semiconductor devices used for LSI, CPU, or the like in addition to the above display device can be manufactured with high yield at low cost.

It is not shown; however, what is called a staggered TFT can be obtained as follows: a source electrode and a drain electrode are previously formed over a substrate by a droplet discharge method; a semiconductor film and a gate insulating film are formed by plasma CVD or the like; a gate electrode is formed by a droplet discharge method; and n-type or p-type impurities are doped into the semiconductor film using the gate electrode as a mask. The invention can be applied to the fabrication of a semiconductor device or an active matrix substrate using the staggered TFT.

Embodiment 1

In this embodiment, the fabrication method of an active matrix substrate with the use of the invention will be described with reference to FIG. 6A to FIG. 8B. In particular, the case of using PVA for first organic films and using polyimide or acrylic for a second organic film in order to form contact holes will be described.

First, a base insulating film 601 is formed over a substrate 600. Here, a silicon oxynitride film (SiNO) is formed to a thickness of 10 nm to 200 nm by plasma CVD to form the base insulating film 601. The material of the base insulating film 601 is not limited to SiNO, and a silicon film oxide, a silicon nitride film, or a silicon oxynitride film; or a stack thereof may be used. Further, the base insulating film 601 is not necessarily formed.

Next, a semiconductor film is formed to a thickness of 10 nm to 80 nm over the base insulating film 601. The surface of the semiconductor film is treated with a solution containing nickel, and a crystalline silicon semiconductor film is obtained by subsequent heat treatment at 500° C. to 750° C.; further, the crystallinity of the crystalline semiconductor film is improved by laser crystallization. Note that another semiconductor having an amorphous structure, such as a silicon germanium (SiGe) alloy may be used for the semiconductor film. Further, the semiconductor film may be formed by sputtering, LPCVD, or the like. The crystallization may be performed by laser crystallization, thermal crystallization, thermal crystallization using another catalyst (Fe, Ru, Rh, Pd, Pd, Os, Ir, Pt, Cu, Au, or the like), or by alternating the processes. The catalyst is dissolved or dispersed in a solution and applied over the semiconductor film by a known method such as sputtering or application with a spinner. For example, nickel acetate salt solution containing nickel by 10 ppm in weight may be applied to the surface of the semiconductor film.

In addition, a continuous-wave laser may be used for the crystallization of a semiconductor film having an amorphous structure. In order to obtain a crystal with a large grain size in crystallizing, a solid state laser capable of continuous wave oscillation may be used and it is preferable to apply from a second harmonic to a fourth harmonic of a fundamental wave. Typically, a second harmonic (532 nm) or a third harmonic (355 nm) of a fundamental wave of an Nd:YVO$_4$ laser (a fundamental wave: 1064 nm) may be applied. When a continuous-wave laser is used, laser light emitted from a continuous-wave YVO$_4$ laser of which output is 10 W is converted into a harmonic by a non-linear optical element. In addition, there is a method for emitting a harmonic by putting an YVO$_4$ crystal and a nonlinear optical element in a resonator. Then, the laser light is preferably shaped into a rectangular shape or an ellipse shape in an irradiated surface with an optical system to irradiate a subject. At this time, the energy density ranging approximately from 0.01 MW/cm$^2$ to 100 MW/cm$^2$ (preferably, from 0.1 MW/cm$^2$ to 10 MW/cm$^2$) is needed. Thereafter, the semiconductor film may be irradiated by moving it relatively to the laser light at a speed ranging appropriately from 10 mm/s to 2000 mm/s.

After obtaining the crystalline silicon semiconductor film with the above-mentioned method, an amorphous silicon film for gettering a metal catalyst away is formed by an oxide film on the semiconductor film to carry out gettering treatment by heat treatment at temperatures from 500° C. to 750° C. Further, the amorphous silicon film containing the metal catalyst is etched away.

Furthermore, desirably, in order to control a threshold value of a TFT element, a boron ion with a concentration ranging appropriately from $1\times10^{13}$ to $3\times10^{13}$ atoms/cm$^2$ or more is injected into the crystalline silicon semiconductor film.

Thereafter, the crystalline silicon semiconductor film is etched with the use of a first mask pattern, and crystalline silicon semiconductor island films 602 to 606 are formed by etching. The first mask pattern is preferable formed by a droplet discharge method in view of simplifying the process. In this case, the first mask pattern is preferably formed with a resist or a heat resistant high molecular weight material. It is preferable to use a high molecular weight material containing high polarity heteroatoms with less aliphatic part and further contains an aromatic ring and a heterocyclic ring as a principal chain. Polyimide and polybenzimidazole can be given as typical examples of such a high molecular weight material. In the case of using polyimide, a composition containing polyimide is discharged from the liquid discharge nozzle and applied onto the semiconductor island film and baked at 200° C. for 30 minutes; thus, the first mask pattern is formed. Next, after removing the first mask pattern, a gate insulating film 607 is formed on the crystalline silicon semiconductor island films 602 to 606. The gate insulating film 607 is formed to a film thickness of 1 nm to 200 nm by plasma CVD or sputtering. It is preferable to perform surface nitriding treatment using plasma by a microwave after the gate insulating film containing silicon is formed in a single layer or a layered structure to have a film thickness thin as 10 nm to 50 nm.

When an insulating film having such a thin film thickness is formed by plasma CVD, it is necessary to obtain a thin film thickness by slowing down a deposition rate and fully controlling the thickness. For example, a deposition rate of a silicon oxide film can be set at 6 nm/min under a RF power of 100 W; a frequency, 10 kHz; a pressure, 0.3 Torr; a flow rate of a N$_2$O gas, 400 sccm; and a flow rate of a SiH$_4$ gas, 1 sccm. In addition, the nitriding treatment using plasma by a microwave is performed by using a microwave source (2.45 GHz) and a nitrogen gas which is a reactive gas.

Note that a nitrogen concentration decreases as the distance from the surface of the gate insulating film 607 is longer. Accordingly, the silicon oxide surface not only can be nitrided with a high concentration but also nitrogen at an interface between the silicon oxide film and an active layer is decreased, which prevents deterioration of the device performance.

Next, conductive films 608a and 608b having a film thickness of 100 nm to 600 nm is formed on the gate insulating film 607. Here, a conductive film formed with a stack of a TaN film and a W film is formed by sputtering method; however, it is not limited thereto and may be formed from metal such as Ag, Au, Cu, Cr, Ni, Pt, Pd, Ir, Rh, Al, Mo, Cd, Zn, Fe, Ti, Si, Ge, Zr, or Ba; a single layer of an alloy material or a compound material containing the above elements as the main component; or a stack thereof. In addition, a semiconductor film typified by a polycrystalline silicon film doped with an impurity element such as phosphorus may be used.

Next, second mask patterns 609a to 609g are formed. The second mask patterns 609a to 609g are preferably formed by a droplet discharge method as the first mask pattern to simplify the process (FIG. 6A).

The conductive films 608a and 608b are etched by dry etching or wet etching using the second mask patterns 609a to 609g (first etching) as masks. A gate electrode 610 of a pixel TFT, gate electrodes 611 to 613 of a driving TFT, a capacitor wiring 614 serving as a top electrode of a storage capacitor area, and wirings 615 and 616 which have first shape (tapered shape) are obtained by the first etching. The etching method is not particularly limited, and ICP (inductively coupled plasma) etching may be preferably performed for example. CF$_4$ and Cl$_2$, or the like are used for the etching gas. (FIG. 6B) Next, gate electrodes 617 to 620 and wirings 621 to 623, which have second shape may be formed by second etching as the second mask patterns 609a to 609g are left intact. (FIG. 6C)

Subsequently, $10^{13}$ atoms/cm$^3$ to less than $10^{14}$ atoms/cm$^2$ of an n-type impurity element is injected into semiconductor island films 602 to 606 by doping using the gate electrodes 617 to 620 and the wirings 617 to 623 which have second shape as masks. After that, the second mask patterns 609a to 609g are removed by O$_2$ ashing or the like. The order of the removal steps of the second mask patterns 609a to 609g and the doping injection step may be exchanged. (FIG. 6C)

The parts which are to be p-channel TFTs 652 and 653 and portions of a pixel TFT 654 are covered with third mask patterns 624a and 624b, and $10^{14}$ atoms/cm² to less than $10^{16}$ atoms/cm² of an n-type impurity element is further added. Consequently, n-type impurity regions (n⁺) 625a and 625b which are to be a source drain and a drain region, and the impurity regions 626a to 626b with lower impurity concentration than the n-type impurity regions (n⁺) (hereinafter each referred to as a lightly doped drain (LDD) region) are formed. Further, channel regions 627a and 627b are respectively formed between the pairs of LDD regions. (FIG. 7A) The third mask patterns 624a to 624b are thereafter removed by $O_2$ ashing or the like.

Next, fourth mask patterns 628a and 628b are formed over at portions which are later to be n-channel TFTs of a driver circuit and pixel TFTs 654 are formed, and p-type impurity regions 629a and 629b are formed by doping a p-type impurity element. Further, channel regions 630a and 630b are respectively formed between the pairs of the p-type impurity regions 629a and 629b. The impurity concentration of the p-type impurity regions 629a and 629b may be set at $10^{15}$ atoms/cm³ to less than $10^{17}$ atoms/cm³. (FIG. 7B) The fourth mask patterns 628a and 628b are thereafter removed by $O_2$ ashing or the like.

Note that it is desirable that the third and the fourth mask patterns be formed by a droplet discharge method as well as the first and the second mask patterns in view of the simplification of the process.

A cap insulating film (not shown) covering the TFTs is formed by plasma CVD. It is preferable to use a silicon nitride film or a silicon oxynitride film for the cap insulating film. However, the material of the cap insulating film is not limited thereto. Further, the formation method is not either limited to plasma CVD. The cap insulating film may not be formed in the case of simplifying the process.

Heat treatment is performed to activate the impurity element added to the semiconductor film. The activation is performed by heating under $N_2$ atmosphere at 500° C. to 800° C. in a furnace. For example, RTA (rapid thermal annealing) may be performed. Alternatively, the activation may be performed by laser irradiation. In this case, the laser may be applied to only either surface side of the substrate or to the both surfaces of the substrate. The activation process may be omitted in the case of simplifying the process.

Next, an insulating film 631 formed with a silicon nitride film or a silicon oxynitride film each of which contains hydrogen is formed by plasma CVD. Then, heat treatment is performed to dehydrogenate the insulating film 631 and hydrogenate the semiconductor film thereby terminating a dangling bond of silicon. The heat treatment can be performed with a clean oven under $N_2$ atmosphere at 350° C. to 450° C. (preferably, 410° C.). The insulating film 631 may be formed with another insulating film containing hydrogen and oxygen by other than plasma CVD. The formation and the hydrogenation of the insulating film 631 may be omitted in the case of simplifying the process.

Next, the first organic films 119 are selectively formed at portions over the insulating film 631 where contact holes reaching source regions or drain regions 625a to 625c, 629a, and 629b, or wirings 623 by a droplet discharge method. Here, the first organic films 119 are formed of a material in which polyvinyl alcohol (PVA) is mixed into $H_2O$ solution.

Figure 7A:
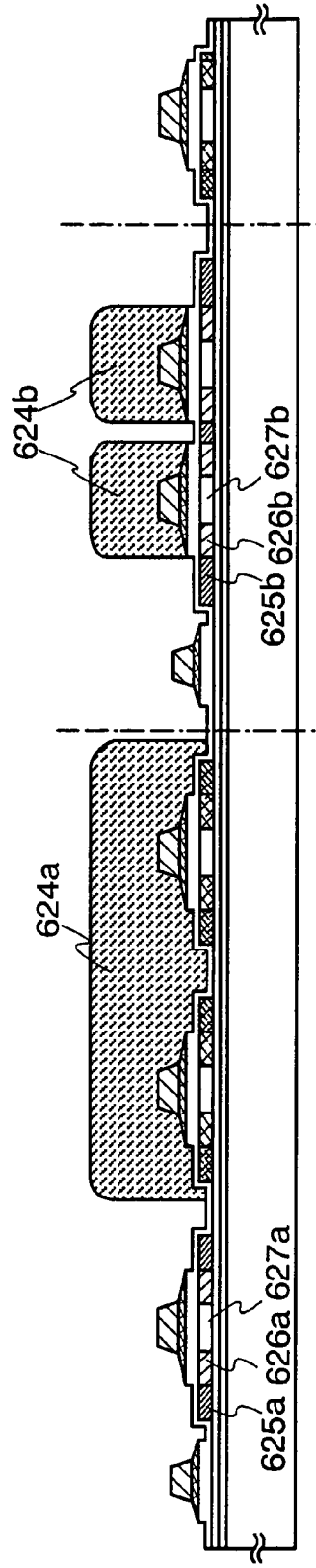
FIGS. 7A to 7C are figures describing a fabrication method of an active matrix substrate.
Figure 7B:
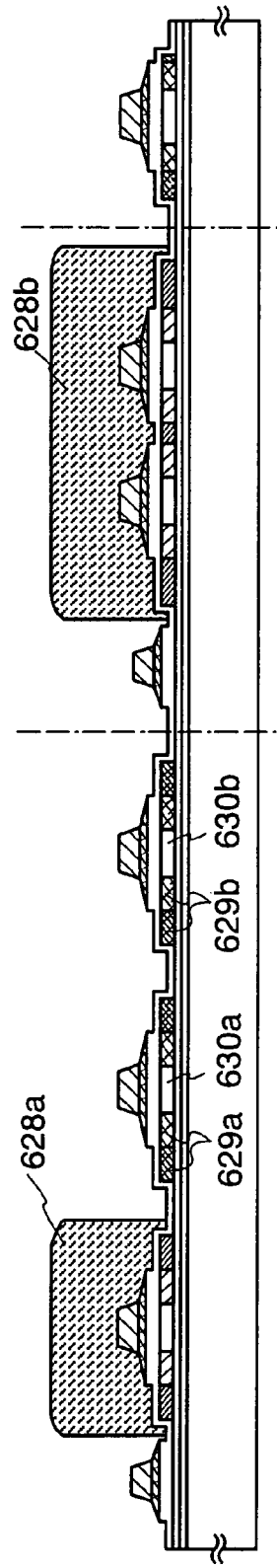
Figure 7C:
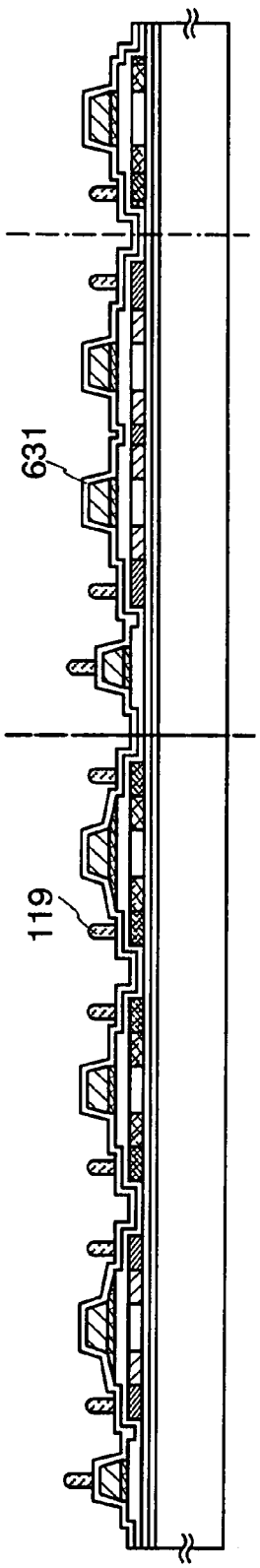

The surfaces of the first organic films 119 are treated so as to be repellent to the second organic film 120 to be formed later. Here, the first organic films 119 are treated with $CF_4$ plasma; however, the method is not limited thereto. In the case where an organic material which is intrinsically liquid repellent is used, the liquid repellent treatment can be omitted. (FIG. 7C)

Figure 8A:
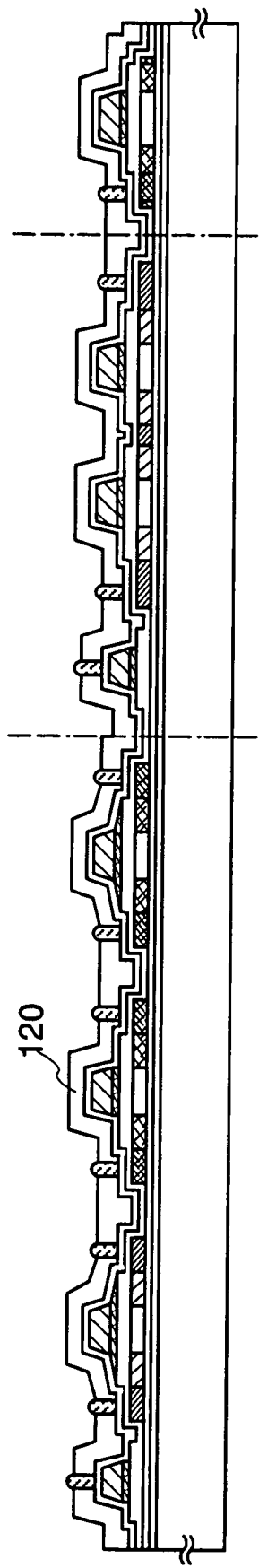
FIGS. 8A and 8B are figures describing a fabrication method of an active matrix substrate.
Figure 8B:
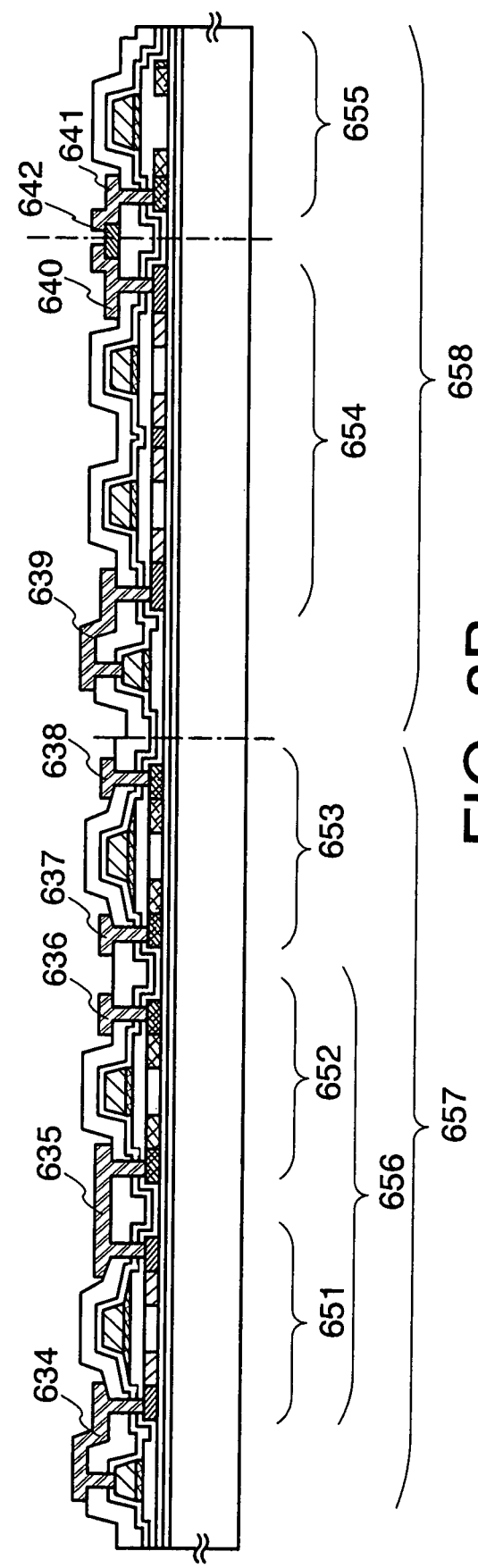

The second organic film 120 is formed in the area where the first organic films are not formed. Here, a solution in which polyimide is dissolved in a solvent containing ethyl lactate and y butyrolactone is applied over the entire surface of the substrate by spin coating; however, the material and the method are not limited thereto. For example, an insulating film having a Si—O bond and a Si—$CH_x$ bond, which is formed from acrylic resin, polyamide resin, or a siloxane material, other than polyimide resin. Further, the second organic film 120 can be formed by a droplet discharge method or the like. (FIG. 8A)

After the second organic film 120 is formed, the first organic films 119 and the gate insulating film 607 formed thereunder are removed. The insulating film 631 for hydrogenation and the cap insulating film are removed if they have been provided.

Here, the first organic films 119 containing PVA are removed by using $H_2O$. Further, the gate insulating film 607 or the like under the first organic films 119 are removed by dry etching using a mixture of $CF_4$ and $O_2$; however, it is not limited thereto. The first organic films 119, the gate insulating film 607, and the like may be removed in stages or may be removed at once.

It is believed that the PVA used in this embodiment is a superior material in view of environmental concerns since it can be easily removed with $H_2O$.

By removing the first organic films 119, the gate insulating film 607, and the like as described above, contact holes are formed at portions where the first organic films 119 have been, that is, the portions over the source regions or drain regions 625a, 625b, 629a, and 629b; and the wiring 623.

After the contact holes are formed, connection wirings 634 to 641 formed of a conductive material are formed so as to electrically connect the respective TFTs. Here, the connection wirings 634 to 641 are formed by stacking a Ti film with a thickness of 50 nm to 200 nm, an Al film or an Al—Si alloy film with a thickness of 250 nm to 400 nm, and a Ti film with a thickness of 50 nm to 200 nm which are formed by a droplet discharge method. However, the conductive material and the formation method are not limited thereto. Accordingly, another conductive material shown in the embodiment modes, or a conductive material may be conventionally applied by sputtering or the like and etched after patterning.

In the case of using a droplet discharge method, a pasted material in which a conductive material is dissolved or dispersed in a solvent is discharged from a droplet discharge nozzle to form wirings. As to the three layer structure, Ti may be replaced by TiN or titanium nitride (Ti(N)) containing nitrogen by 50% or less in composition ratio; alternatively, a structure in which TiN or Ti(N) is newly stacked on and under the three layers. Further, since hillocks are formed at 150° C. to 200° C. in the case of Al, it is preferable to add Si.

Further, a pixel electrode 642 is formed before forming connection wirings 634 to 641 in a pixel area 658. The pixel area may be formed with a conductive film of such as of ITO, ITSO, IZO, or GZO. A pasted material in which the above conductive materials are dissolved and dispersed in a solution may be applied by a droplet discharge method. The pixel electrode 642 may be formed by a conventional sputtering method. Further, a layered structure of conductive layers containing the materials may be used. The pixel electrode 642 is electrically connected to a drain region of the pixel TFT 654 and a bottom electrode of a storage capacitor 655 (parts of a semiconductor film doped with impurities). The pixel electrode 642 may be formed before forming the connection wirings 634 to 641.

Through the above steps, a driver circuit 657 including a CMOS structure 656 having an n-channel TFT 651 and a p-channel TFT 652; and a pixel area 658 including the pixel TFT 654 and the storage capacitor 655 can be fabricated.

With a fabrication method of an active matrix substrate according to this embodiment, in forming a plurality of contact holes, films containing PVA are formed as the first organic films 119 and the second organic film is formed of polyimide or acrylic around the first organic films 119 after $CF_4$ plasma treatment; thus, good contact holes can be accurately formed in a simple process. Further, PVA can easily be removed with $H_2O$ in order to form the contact holes; therefore, it is also advantageous in view of environmental concerns.

In forming electrodes 618 to 620, wirings 621 to 623, connection wirings 634 to 641, and various mask patterns by a droplet discharge method, liquid containing the material of the films can be applied to an arbitrary area by changing the relative positions of the substrate and a discharge nozzle from which the liquid is discharged. Further, the thickness or the width of the patterns to be formed can be controlled by changing the nozzle diameter, the liquid discharge rate, and relative relationship among the movement speeds of the nozzle and the substrate where the discharged material is applied. Thus, the material of the films can be accurately discharged and the films can be formed in the desired area. Since exposure and development using a resist mask, and the like can be omitted, significant simplification of the process and the cost reduction can be attempted. Further, by using the droplet discharge method, patterns can be formed on an arbitrary area and the thickness and the width of the patterns to be formed can be controlled. Thus, even a large active matrix substrate having a side of 1 m to 2 m can be fabricated with high yield at low cost.

In this embodiment, a crystalline semiconductor film is used for each of the pixel area 658 and the driver circuit 657. Alternatively, an amorphous semiconductor film may be used for the pixel area 658 and a crystalline semiconductor film may be used for the driver circuit 657 which requires high speed operation. A semiconductor film having another amorphous structure, including amorphous silicon, silicon germanium (SiGe) alloy may be used. Further, semiamorphous silicon (SAS) may be used for a crystalline semiconductor film in the driver circuit area 657. The pixel area may be formed over the substrate and the pixel area and a driver circuit area formed separately may be connected by TAB or the like.

Here, a semiamorphous semiconductor will be described. A semiamorphous semiconductor is referred to a semiconductor which has a structure between an amorphous structure and a crystalline structure (including a single crystalline structure, and a polycrystalline structure), the semiamorphous semiconductor film has a third state that is stable with respect to free energy, and includes a crystalline region having short range order and lattice distortion. Crystal grains of 0.5 nm to 20.0 nm in size are contained in at least a part of the semiamorphous semiconductor film, and such film is also referred to as a microcrystalline semiconductor film. Further, and in the Raman spectrum, the peak specific to silicon shifts to the lower side of wave number of 520 $cm^{-1}$, and a diffraction peak of (111) and (220) derived from a silicon crystal lattice is observed in x-ray diffraction. Further, the semiamorphous semiconductor film contains hydrogen or halogen of at least 1 atom % as a terminator for a dangling bond.

Semiamorphous silicon is obtained by glow discharge decomposition with silicide gas by plasma CVD. As the silicide gas, $SiH_4$, $Si_2H_6$, $SiH_2Cl_2$, $SiHCl_3$, $SiCl_4$, $SiF_4$, or the like can be used. The silicide gas may be diluted with one or more rare gas elements selected from the group consisting of $H_2$, a mixture of $H_2$ and He, Ar, Kr, and Ne. The dilution ratio may be in the range of from 1:2 to 1:1,000. The pressure may be approximately in the range of from 0.1 Pa to 133 Pa. The power frequency is in the range of from 1 MHz to 120 MHz, preferably 13 MHz to 60 MHz. The substrate heating temperature may be set at 300° C. or less, preferably from 100° C. to 250° C. As for impurity elements contained in the film, each concentration of impurities in atmospheric constituents such as oxygen, nitrogen, and carbon is preferably set at $1\times10^{20}$ atoms/$cm^3$ or less. In particular, the oxygen concentration is set at $5\times10^{19}$ atoms/$cm^3$ or less; more preferably, $1\times10^{19}$ atoms/$cm^3$ or less. The mobility of the TFT using the semiamorphous silicon film as the active layer is $\mu=1$ $cm^2$/Vsec to $\mu=10$ $cm^2$/Vsec.

Embodiment 2

In this embodiment, a fabrication method of an active matrix substrate in the case of using fluoroalkyl silane (FAS) for a first organic film used for forming a contact hole, and using polyimide or acrylic for a second organic film will be described.

The steps for forming a semiconductor film, a gate insulating film, a gate electrode, and the like over a substrate are similar to the steps shown in Embodiment 1 or in the embodiment modes (FIGS. 6A to 7C). Further, an insulating film for hydrogenation and a cap insulating film may be formed as necessary.

In a state shown in FIG. 7C, fluoroalkyl silane (FAS) represented by a formula $R_n$—Si—$X_{4-n}$ (n=1, 2, 3) (the first organic films 119) are selectively formed at portions above a gate insulating film where contact holes reaching source regions or drain regions 625a, 625b, 629a, and 629b, and wirings 623 by a droplet discharge method. Here, X denotes a hydrolysate group such as a methoxy group, an ethoxy group, or a halogen atom. Meanwhile, R denotes a fluoroalkyl group having a structure of $(CF_3)(CF_2)_x(CH_2)_y$ (x is an integer in the range of 0 to 10, and y is an integer in the range of 0 to 4). When a plurality of Rs or Xs are bound to Si, the Rs or Xs may be the same or different from each other.

Heptadeca fluoro-1,1,2,2 tetrahydro decyl triethoxysilane; heptadeca fluoro-1,1,2,2 tetrahydro decyl trimethoxysilane; heptadecafluoro-1,1,2,2 tetrahydro decyltrichlorosilane; tridecafluoro-1,1,2,2 tetrahydro octyl triethoxysilane; tridecafluoro-1,1,2,2 tetrahydro octyl trimethoxysilane; tridecafluoro-1,1,2,2 tetrahydro octyl trichlorosilane, and trifluoropropyl trimethoxysilane are given as FAS. Only one compound or a combination of more than two kinds of the compounds may be used.

Next, a second organic film 120 is formed around the first organic films 119. FAS used for the first organic films 119 is extremely thin (0.1 nm to 100 nm) since it is a monomolecular film; however, FAS intrinsically has high liquid repellency (water repellency, oil repellency). Thus, the second organic film 120 can be formed without liquid repellent treatment such as $CF_4$ plasma treatment. Here, a solution in which polyimide is dissolved in a solvent containing ethyl lactate and y butyrolactone is applied over the entire surface of the substrate by spin coating; however, the material and the method are not limited thereto. For example, an insulating film having a Si—O bond and a Si—$CH_x$ bond, which is formed from acrylic resin, polyamide resin, or a siloxane material, other than polyimide resin. Further, the second organic film 120 can be formed by a droplet discharge method or the like.

After the second organic film 120 is formed, the first organic films 119 and the gate insulating film 607 formed thereunder are removed. The insulating film 631 for hydrogenation and the cap insulating film are removed if they have been provided.

The first organic film 119 containing FAS can be easily removed by $O_2$ plasma, UV treatment, UV ozone treatment, heat treatment under $O_2$ atmosphere or the like. Further, the gate insulating film 607 or the like under the first organic films 119 are removed by dry etching using a mixture of $CF_4$ and $O_2$; however, it is not limited thereto. The first organic films 119, the gate insulating film 607, or the like may be removed separately or may be removed at once. In particular, FAS can be etched with $O_2$ gas without any special treatment (such as surface treatment using a fluorine-based silane coupling agent). Thus, contact holes can be formed by removing the first organic films 119, the gate insulating film 607, or the like can be removed at once, and the process can be simplified.

As described, FAS used in this embodiment is intrinsically has high liquid repellency, so that $CF_4$ plasma treatment for obtaining liquid repellency is not necessarily performed. Further, FAS can be etched away as well as other insulating films by using a mixed gas of $CF_4$ and $O_2$, or the like. Thus, FAS is an advantageous material in simplifying the process.

By removing the first organic films 119, the gate insulating film 607, or the like as described above, contact holes are formed at portions where the first organic films 119 have been, that is, the portions over the source regions or drain regions 625a, 625b, 629a, and 629b; and the wirings 623.

After the contact holes are formed, connection wirings 634 to 641 formed of a conductive material are formed so as to electrically connect the respective TFTs. Further, a pixel electrode 642 is formed in a pixel area. The conductive material for forming connection wirings 634 to 641 and the pixel electrode and the formation method may be the same as the method shown in Embodiment Modes or Embodiment 1.

Through the above steps, a driver circuit 657 including a CMOS structure 656 having an n-channel TFT 651 and a p-channel TFT 652; and a pixel area 658 including the pixel TFT 654 and the storage capacitor 655 can be fabricated.

With a fabrication method of an active matrix substrate according to this embodiment, in forming a plurality of contact holes, films containing FAS are formed as the first organic films 119, the second organic film 120 is formed of polyimide or acrylic around the first organic films 119, and the first organic film 119 is removed thereafter; thus, good contact holes can be accurately formed in a simple process. Further, FAS can be etched away as well as the gate insulating film or the like by using an $O_2$ gas, or the like in order to form the contact holes. Thus, FAS is advantageous in simplifying the process.

Embodiment 3

The case of applying the invention to the fabrication of a staggered TFT has been described in Embodiment mode 1. In this embodiment, the case of applying the invention to the fabrication of a channel etch type (channel etching type) TFT will be described with reference to FIGS. 1A to 1C and 10A to 11D.

First, a gate electrode 104 is formed over a substrate 100 by a droplet discharge method. This step can be performed similarly to Embodiment Mode 1 (FIG. 1A).

Next, a gate insulating film 106 is formed over the gate electrode 104. Here a silicon nitride (SiNx) film is formed to a thickness of 100 nm to 400 nm by plasma CVD; however, the silicon nitride film may be formed by another film formation method such as sputtering. Further, the gate insulating film 106 may be formed with another insulating film containing silicon or silicon oxide.

Figure 10A:
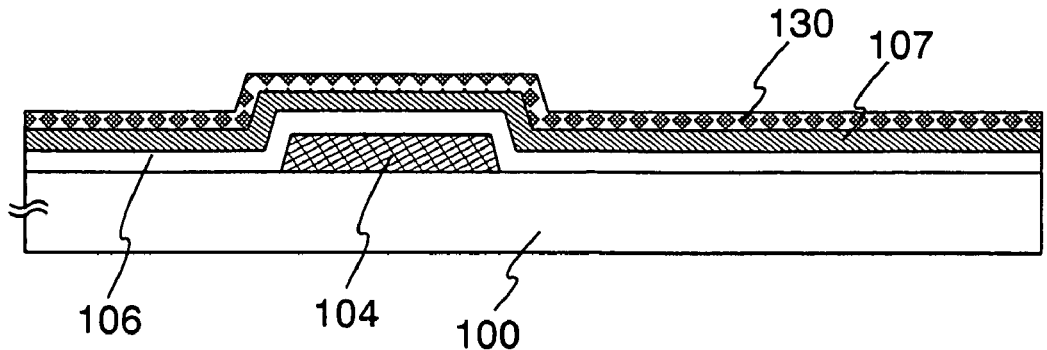
FIGS. 10A to 10D are figures describing a fabrication method of a channel etch type TFT.

A semiconductor film 107 is formed over the gate insulating film 106. Here, an amorphous silicon film is formed to a thickness of 10 nm to 300 nm; however, another crystalline semiconductor or a semiamorphous semiconductor (SAS) may also be used. The thickness is preferably 10 nm to 60 nm. Next, an n-type semiconductor film 130 is formed over the semiconductor film 107. Here, an n-type (n+) amorphous semiconductor film is formed to a thickness of 40 nm to 60 nm is formed (FIG. 10A).

The gate insulating film 106, the semiconductor film 107, and the n-type semiconductor film 130 can be formed continuously in one chamber of such as a plasma CVD system. It is desirable to set the formation temperature of the gate insulating film 106 at as high as 300° C. or more, and to set the formation temperature of the amorphous silicon film at 300° C. or less where hydrogen mixed inside is not desorbed, in order to stabilize TFT characteristics and to improve the performance.

Figure 10B:
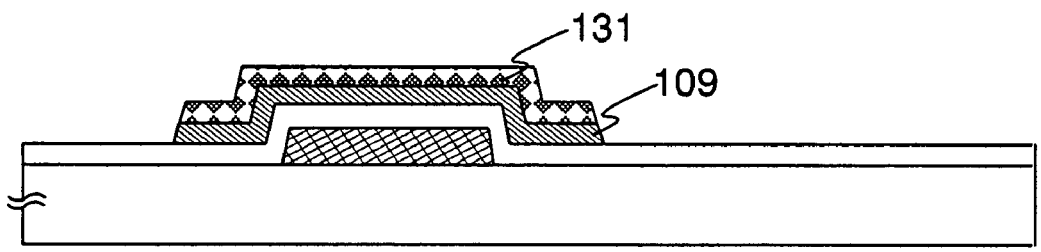

Subsequently, the semiconductor film 107 and the n-type semiconductor film 130 are etched to island shape using a first mask pattern to form an island shape semiconductor 131 and an island shape n-type semiconductor film 131 and an island shape semiconductor film 109. The first mask pattern is preferably formed by a droplet discharge method as in Embodiment Mode 1. Thereafter, the first mask pattern is removed. (FIG. 10B)

A source electrode 132 and a drain electrode 133 are formed above the part to be a source region and a drain region in an n-type semiconductor island film 131 by a droplet discharge method using a nozzle 138. As a conductive material, the same material as the gate electrode 104 or the scan line 105 may be dissolved or dispersed in a solvent. For example, a composition containing Ag is selectively discharged and baked by heat treatment to form each electrode with a thickness of 600 nm to 800 nm.

Figure 10C:
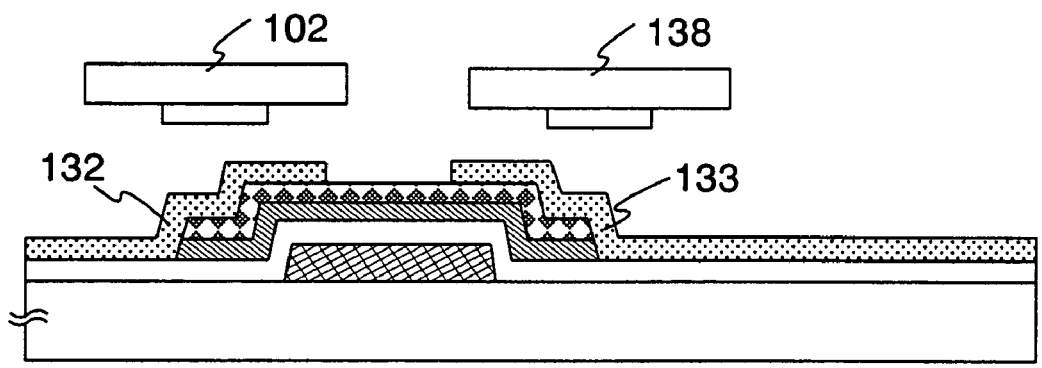
Figure 10D:
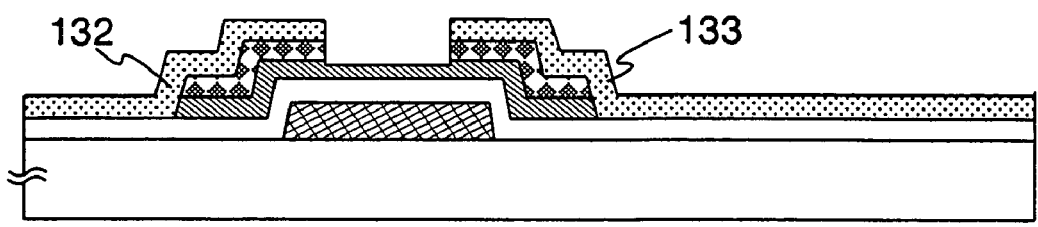

A source electrode 132 and a drain electrode 133 may be formed by previously sputtering a conductive film, forming a mask pattern by a droplet discharge method, and thereafter etching the conductive film. (FIG. 10C)

Next, the top parts of the n-type semiconductor film 130 and the semiconductor film 107 are etched away using the source electrode and the drain electrode as masks. On this occasion, it is necessary to set appropriate etching condition in order to minimize damage to the semiconductor film to be a channel region of the TFT.

Next, a passivation film 118 is formed over the source electrode 132, the drain electrode 133, and the semiconductor film 107. The passivation film may be formed of an insulating material such as silicon nitride, silicon oxide, silicon nitride oxide, silicon oxynitride, aluminum oxynitride, aluminum oxide, DLC, nitrogen containing carbon by a film formation method such as plasma CVD or sputtering. Further, a stack of the materials may be used for the passivation film 118.

Next, the first organic film 119 is selectively formed by a droplet discharge method using a nozzle 139 in the area over the passivation film 118 where contact a hole reaching a source electrode or a drain electrode is to be formed. It is desirable to use PVA or FAS shown in Embodiments 1 and 2 for the first organic film 119; however, the material is not limited thereto.

Figure 11A:
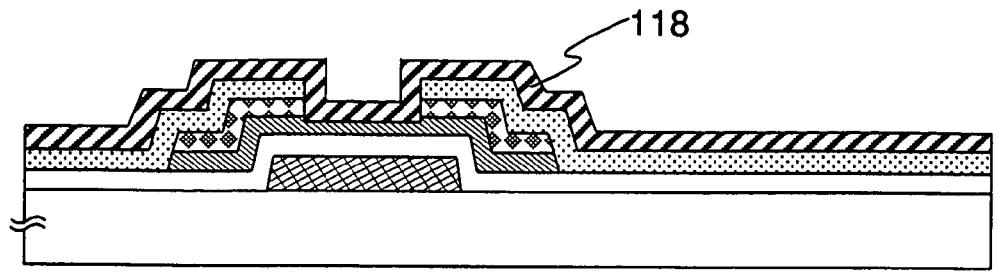
FIGS. 11A to 11D are figures describing a fabrication method of a channel etch type TFT.
Figure 11B:
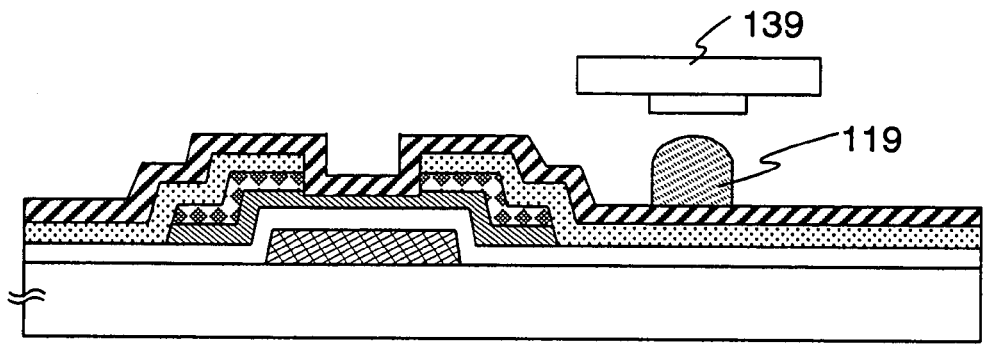
Figure 11C:
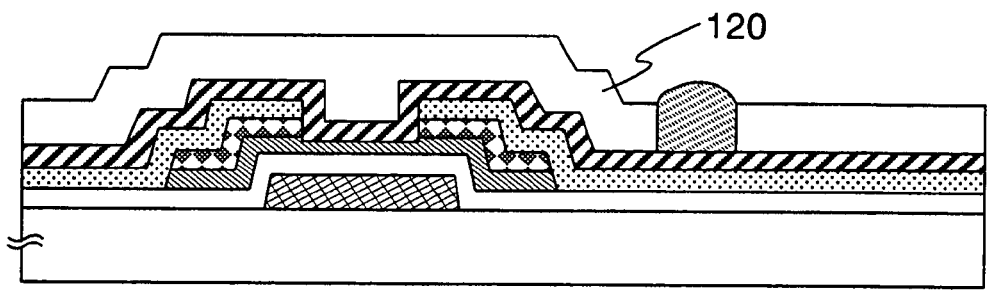
Figure 11D:
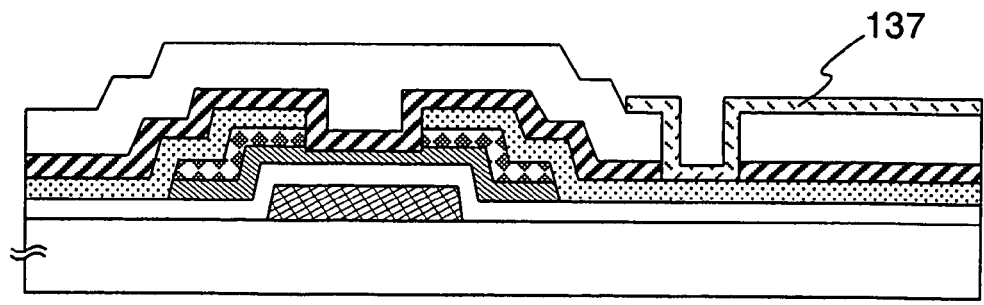

Next, a second organic film 120 is formed in an area where the first organic film 119 is not formed. It is preferable to use polyimide resin or acrylic resin shown in Embodiments 1 and 2 for the second organic film 120; however, the material is not limited thereto. (FIG. 11C)

After the second organic film 120 is formed, the first organic film 119 and parts of the passivation film 118 are removed. The removal method may be the same as the method shown in Embodiment 1 or Embodiment 2. Thus, a contact hole is formed over the area where the first organic film 119 has been, that is, over the source electrode or the drain electrode.

After the contact hole is formed, a conductive film 137 for connecting to the source electrode 132 or the drain electrode 133 is formed. A transparent conductive film of such as ITO or ITSO, organic indium, organotin, ZnO, TiN, Ti, Al, Ag, Au, Cu, Cr, or the like can be used as a conductive material. Further, the conductive film 137 may have a structure in which layers each containing the above element as the main component are stacked.

The conductive film 137 may be formed by sputtering or the like and shaped by patterning and etching thereafter; however, it is preferable to selectively form the conductive film by a droplet discharge method thereby significantly simplifying the process. In this case, the conductive film is formed by discharging a pasted material in which the conductive material is dissolved and dispersed in a solvent from the nozzle. The conductive film 137 may be formed by stacking layers containing the conductive materials.

Next, a liquid crystal element or a light emitting element (typically, an EL light emitting element) including a layer containing an organic or an inorganic compound is formed over the conductive film 137. Thus, a flat display such as an active matrix liquid display device or an EL light emitting device which can be controlled with the semiconductor device fabricated through the above steps.

A channel etch type TFT described in this embodiment has advantages of a simple fabrication process and a simple structure. Further, by applying the invention, a contact hole, an insulating film, a planarizing film, a gate insulating film can be accurately formed through a simplified process without exposure and development using a resist mask. Accordingly, a semiconductor element used for the above display device or the like can be manufactured with high yield at low cost.

Embodiment 4

In this embodiment, a structure and a manufacturing process of an active matrix type liquid crystal display device using a TFT substrate fabricated according to Embodiments 1 through 3.

Figure 12:
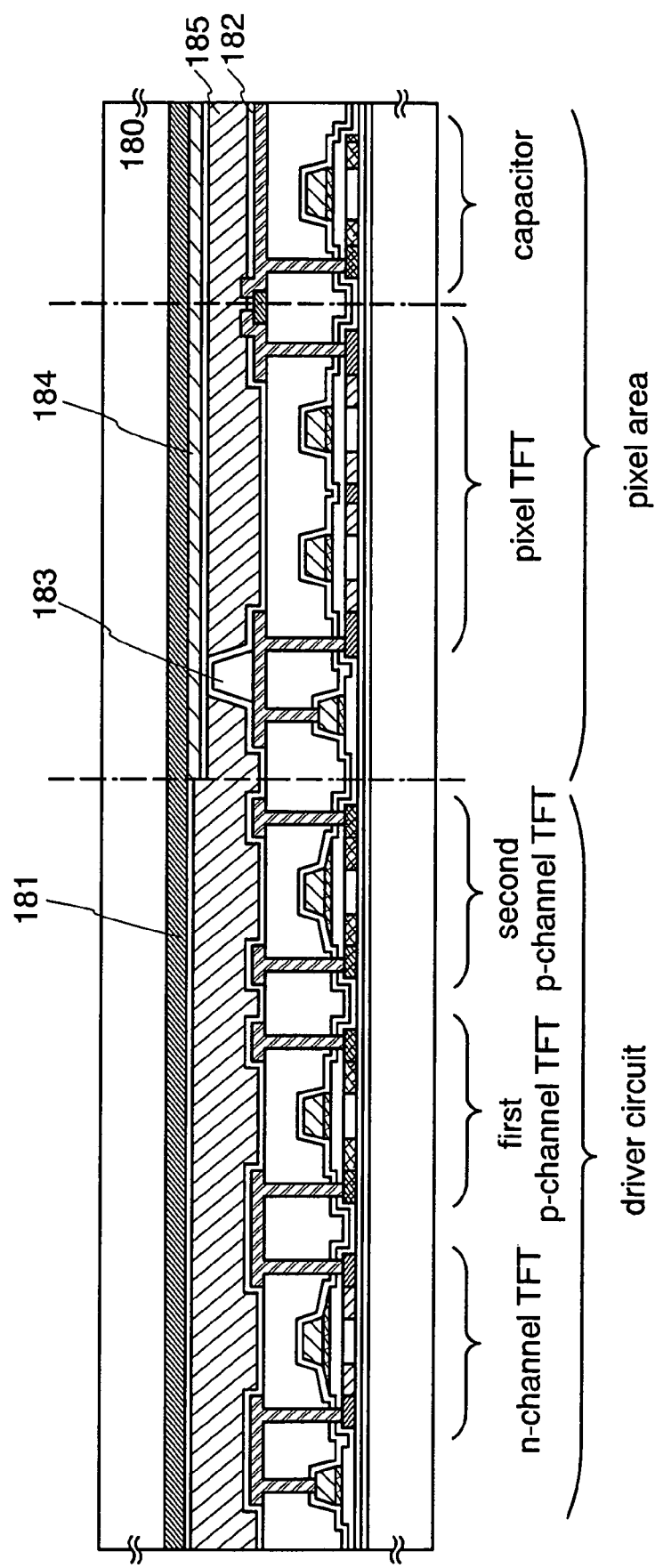
FIG. 12 is a figure describing an active matrix liquid crystal display device.

FIG. 12 shows a state where a TFT substrate and a counter substrate 180 are pasted together with a sealant. The manufacturing process is described below.

A columnar spacer 183 is formed over the TFT substrate. The columnar spacer 183 may preferably be formed in accordance with a depression of a contact portion, which is formed over a pixel electrode. The columnar spacer 183 is formed to a height of 3 µm to 10 µm even it depends on the liquid crystal material. In the case where a depression equivalent to a contact hole is formed at the contact portion; thus, orientation defect can be prevented by forming the columnar spacer 183 accommodated to the depression. Next, an alignment film 182 is formed and rubbed. A transparent conductive film 184 and an alignment film 182 are formed over the counter substrate 180. Then, the TFT substrate and the counter substrate 180 are pasted together with a sealant and the space therebetween is filled with liquid crystal to form a liquid crystal layer 185. Thus, an active matrix type liquid crystal display device can be completed. Note that, the liquid crystal layer 185 may be formed by dropping liquid crystal. This method is effective particularly in the case of manufacturing a liquid crystal display device using an active matrix substrate having a large area as more than 1 m to 2 m.

Embodiment 5

In this embodiment, a structure and a fabrication method of an active matrix type light emitting device using a TFT substrate (an active matrix substrate) obtained in Embodiments 1 through 3 will be described with reference to FIG. 13.

A substrate 1601 is a glass substrate. An n-channel TFT 1652 and a p-channel TFT 1653 are formed in a driver circuit area 1650 over the glass substrate 1601. A switching TFT 1654 and a current control TFT 1655 are formed in a pixel area 1651. Those TFTs are formed from semiconductor films 1603 to 1606, a gate insulating film 1607, gate electrodes 1608 to 1611, and the like.

A silicon oxynitride film, a silicon nitride film, or the like is formed to a thickness of 50 nm to 200 nm to form a base insulating film 1602 over the substrate 1601. An interlayer insulating film is formed with an inorganic insulating film 1618 made of silicon nitride, silicon oxynitride, or the like and an organic insulating film 1619 made of acrylic, polyimide, or the like.

Although circuitry of the driver circuit area 1650 is different between a gate signal driver circuit and a data signal side driver circuit, the explanation thereof is omitted here. Wirings 1612 and 1613 are connected to the n-channel TFT 1652 and the p-channel TFT 1653, and a shift register, a latch circuit, a buffer circuit and the like are formed by using these TFTs.

In the pixel area 1651, a data wiring line 1614 is connected to a source side of the switching TFT 1654, and a wiring 1615 on a drain side is connected to the gate electrode 1611 of the current control TFT 1655. Besides, a source side of the current control TFT 1655 is connected to a power supply line 1617, and an electrode 1616 at a drain side is connected to an anode (also referred to a as a hole injection electrode) 1622 of an EL element.

In forming contact holes where wirings 1612 to 1617 are provided, first organic films which are liquid repellent are formed at portions where the contact holes are to be formed by droplet discharge method. A contact hole and an organic insulating film 1619 can be formed by forming the second organic film around the first organic film.

The EL element 1656 including an anode 1622, a cathode 1624, and a layer in which electroluminescence is obtained and which contains an organic compound or an organic compound (hereinafter referred to as an EL layer) 1623 is formed over the pixel area 1651. Note that, luminescence of the EL layer includes light emission (fluorescence) obtained when a singlet excited state is returned to a ground state, and light emission (phosphorescence) obtained when a triplet excited state is returned to the ground state, and both are included.

The EL element 1656 is provided after insulators (referred to as a partition wall, a bank, or the like) 1620 and 1621 are formed using an organic resin such as acrylic or polyimide, preferably a photosensitive organic resin so as to cover the wirings. In this embodiment, the EL element 1656 includes an anode 1622 formed of ITO (indium tin oxide), an EL layer 1623, and a cathode (also referred to as an electron injection electrode) 1624 formed by using a material such as an alkaline metal or an alkaline-earth metal, for example, MgAg or LiF. The insulators 1620 and 1621 are formed so as to cover each end of the anode 1622, and are provided to prevent the cathode 1624 and the anode 1622 from short-circuiting at the portion. In forming insulators 1620 and 1621, the first organic films which are liquid repellent are formed at the part where the EL element 1656 is formed and the second organic film 120 is formed therearound; thus, the part where the EL element is formed and the insulators 1620 and 1621 may be formed.

Here the anode 1622 may use another transparent conductive film of such as ITSO, ZnO, IZO, or GZO without limitation to ITO. In the case of using ITSO for the anode 1622, ITSO layers each containing a different concentration of silicon oxide may be stacked. Preferably, the lower ITSO layer (on the side of a source connection wiring or a drain connection wiring) has lower silicon oxide concentration, and the upper ITSO layer (on the side of a light emitting layer) has higher silicon oxide concentration. Thus, the efficiency of hole injection into an EL layer 1623 can be improved keeping low resistance of the connection with a TFT. Naturally, a layered structure of another material and ITSO (for example, a layered structure of a lower layer of ITO and an upper layer of ITSO), or a layered structure of other materials than ITSO may be used.

An EL layer 1623 is formed by vapor deposition or coating. Note that in order to improve reliability, before forming the EL layer 1623, it is preferable to use a mercury lamp for a light source, to perform ultraviolet (UV) irradiation, and vacuum heating to deaerate. For example, before carrying out vapor deposition of an organic compound material, it is desirable to perform heat treatment under reduced pressure or an inert atmosphere at 200° C. to 300° C. in a low-pressure atmosphere or an inert atmosphere to remove gas contained in the substrate before depositing the organic compound material. When vapor deposition is used to form the EL layer 902, vapor deposition is performed in a film formation chamber evacuated to a vacuum degree of $5 \times 10^{-3}$ Torr (0.665 Pa) or less, preferably $10^{-4}$ Torr to $10^{-6}$ Torr. In the vapor deposition, the organic compound is previously vaporized by resistance heating, and is scattered in the direction of the substrate when a shutter is opened during vapor deposition. The vaporized organic compound is scattered upward and deposited on the substrate through an opening provided in a metal mask.

For example, white luminescence can be obtained by sequentially stacking, $Alq_3$ partially doped with a nile red which is red light-emitting pigment, $Alq_3$ p-EtTAZ, and TPD (aromatic diamine).

In addition, as for the EL layer 1623, for example, CuPc (20 nm) may be formed as the hole injection layer, molybdenum oxide ($MoO_x$) and α-NPD (40 nm) may be formed as the hole transport layer, $Alq_3$: DMQd (375 nm) (DMQd: quinacridon derivative) may be formed as the light-emitting layer, and $Alq_3$ (375 nm) may be formed as the electron transport layer.

In addition, when the EL layer 1623 is formed by coating using spin coating, after the coating, it is desirable to be baked with vacuum heating. For example, poly (ethylene dioxythiophene)/poly (styrenesulfonic acid) solution (PEDOT/PSS) serving as a hole injection layer is applied over the entire surface and baked. Thereafter, polyvinyl carbazole (PVK) doped with a light-emitting center pigment serving as a luminescence center pigment (1,1,4,4-tetrapheny-1,3-butadiene (TPB), 4-dicyanomethylene-2-methyl-6-(p-dimethylamine-styryl)-4H-pyran (DCM1), nile red, coumarin 6, or the like) may be applied over the entire surface and baked. Note that water is used for a solvent of PEDOT/PSS, which is not soluble in an organic solvent. Accordingly, there is no concern that the PEDOT/PSS dissolves again even when PVK is applied thereover. In addition, PEDOT/PSS and PVK have different solvents; therefore, it is preferable not to use the same film formation chamber. The EL layer 1623 can be formed in a single-layer, and electron transporting 1,3,4-oxadiazole derivative (PBD) may be dispersed in hole transportion polyvinyl carbazole (PVK). In addition, white luminescence is obtained by dispersing 30 wt % of PBD as an electron transport agent and by dispersing four kinds of pigments (TPB, coumarin 6, DCM1, and nile red) in an appropriate amount.

In addition, the EL layers may be separately coated with R, G, and B to have a full-color display in one panel.

The cathode 1624 of the EL element is provided on the EL layer 1623. As the cathode 1624, a material including magnesium (Mg), lithium (Li) or calcium (Ca) having a low work function is used. Preferably, an electrode formed of MgAg (a mixed material of Mg and Ag at a ratio of 10 to 1) may be used. In addition, an electrode of an alloy such as Mg Ag Al, Mg In, Li Al, LiFAl, $CaF_2$, or CaN or an electrode in which some of the above alloys are stacked, or an electrode in which Al is applied over the alloys may be used. Alternatively, a film formed from an element belonging to Group 1 or 2 of the periodic table and Al by a co-evaporation method may be used.

Although it is necessary that a stack made of the EL layer 1623 and the cathode 1624 is separately formed for every pixel, since the EL layer 1623 is extremely weak against water, a normal photolithography technology can not be used. Besides, the cathode 1624 fabricated by using alkaline metal is easily oxidized. Accordingly, it is preferable that a physical mask member such as a metal mask is used to selectively form them by a vapor phase method such as vacuum evaporation, sputtering, or plasma CVD as described above. Besides, a protection electrode for protection against outside moisture or the like may be stacked on the cathode 1624. It is preferable that a low resistance material including aluminum (Al), copper (Cu), or silver (Ag) is used for the protection electrode.

In order to obtain high luminance with low electric power consumption, an organic compound (hereinafter referred to as a triplet compound) emitting light by a triplet exciton (triplet) is used as the material forming the EL layer 1623. Note that, a singlet compound denotes a compound emitting light through only singlet excitation, and the triplet compound denotes a compound emitting light through triplet excitation.

As the triplet compound, organic compounds disclosed in the following papers can be cited as typical materials. (1) T. Tsutsui. C. Adachi, S. Saito, Photochemical Processes in Organized Molecular Systems, ed. K. Honda, (Elsevier Sci. Pub., Tokyo, 1991) p. 437-450. (2) M. A. Baldo, D. F. O'Brien, Y. You, A. Shoustikov, S. Sibley, M. E. Thompson, S. R. Forrest, Nature 395 (1988) p. 151-154. (3) M. A. Baldo, S. Lamansky, P. E. Burrrows, M. E. Thompson, S. R. Forrest, Appl. Phys. Lett., 75 (1999) p. 4-6. (4) T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502-L1504. The triplet compound has higher light emission efficiency than the singlet compound, and an operation voltage (voltage required to cause an EL element to emit light) can be lowered to obtain the same emission luminance.

Figure 13:
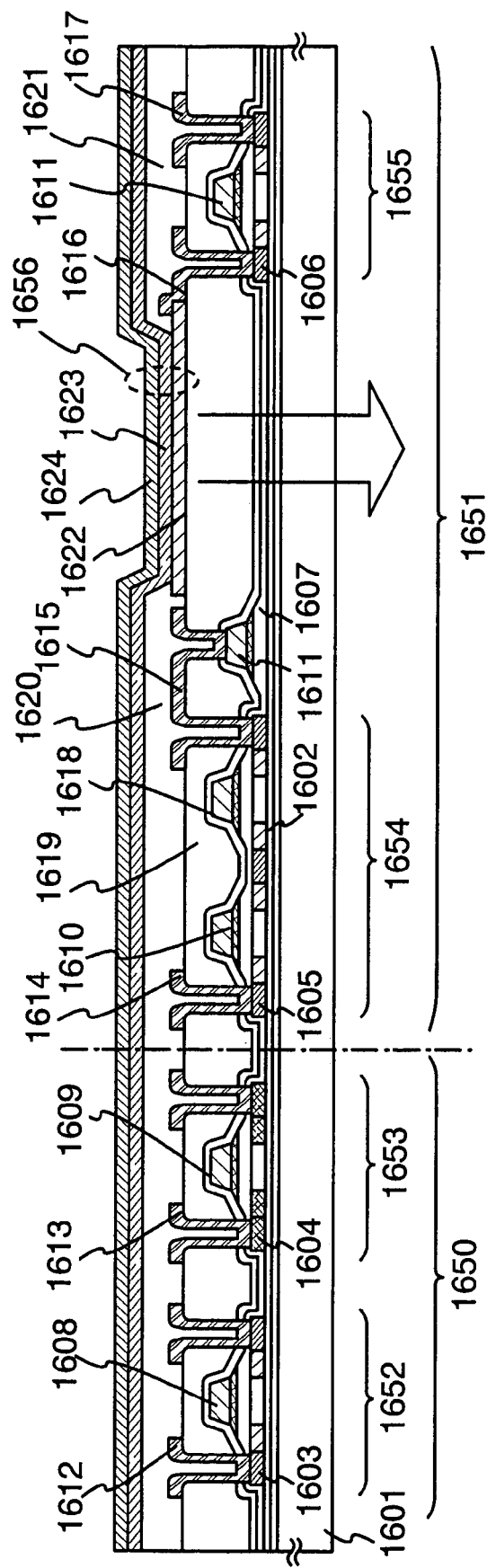
FIG. 13 is a figure describing an active matrix liquid crystal display device.

In FIG. 13, the switching TFT 1654 is made to have a multi-gate structure, and the current control TFT 1655 is provided with an LDD overlapping with the gate electrode. A TFT using polycrystalline silicon has a high operation speed, so that deterioration of hot carrier injection or the like is apt to occur. Thus, as shown in FIG. 13, to form the TFTs (the switching TFT having a sufficiently low off current and the current control TFT resistant to the hot carrier injection)

having different structures according to the functions in a pixel is very effective in fabricating a display device which has high reliability and enables excellent image display (high operation performance). In the manner described above, an active matrix type light emitting device can be completed.

Embodiment 6

In Embodiment 5, the case of applying the invention to the bottom emission light emitting device shown in FIG. 13 has been described. In this embodiment, the invention is applied to a top emission light emitting device shown in FIG. 14A and a dual emission light emitting display device shown in FIG. 14C.

First, the case of the dual emission display device will be described. In this case, a transparent conductive film such as ITO, IT SO, ZnO, IZO, GZO may be used as a material for an anode 1622 as in Embodiment 5. In the case of using ITSO for an anode 1622, ITSO layers each containing a different concentration of silicon oxide may be stacked. Preferably, the lower ITSO layer (on the side of a source or a drain) has lower silicon oxide concentration, and the upper ITSO layer (on the side of a light emitting layer) has higher silicon oxide concentration. Thus, the efficiency of hole injection into an EL layer 1623 can be improved keeping low resistance of the connection with a TFT. Naturally, a layered structure of another material and ITSO (for example, a layered structure of a lower layer of ITO and an upper layer of ITSO), or a layered structure of other materials than ITSO may be used.

Figure 14A:
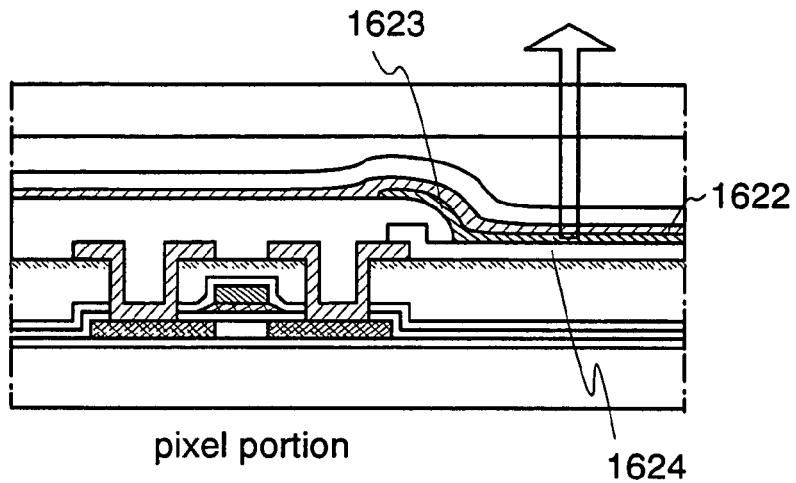
FIGS. 14A to 14C show a top emission type, a bottom emission type, and a dual emission type light emitting devices.
Figure 14B:
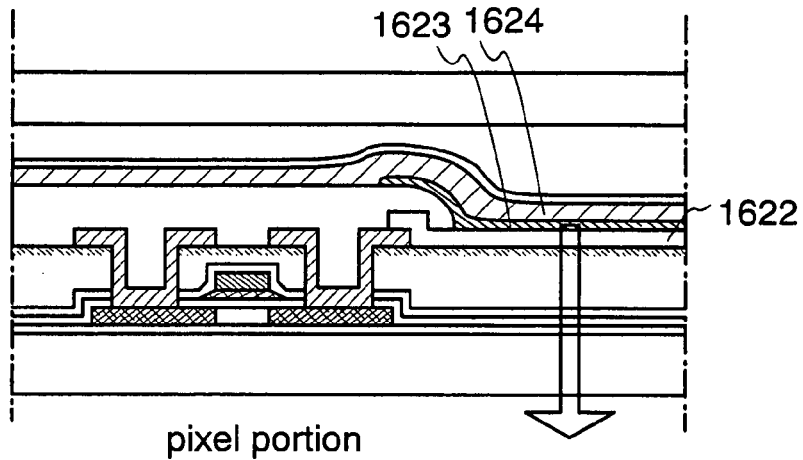
Figure 14C:
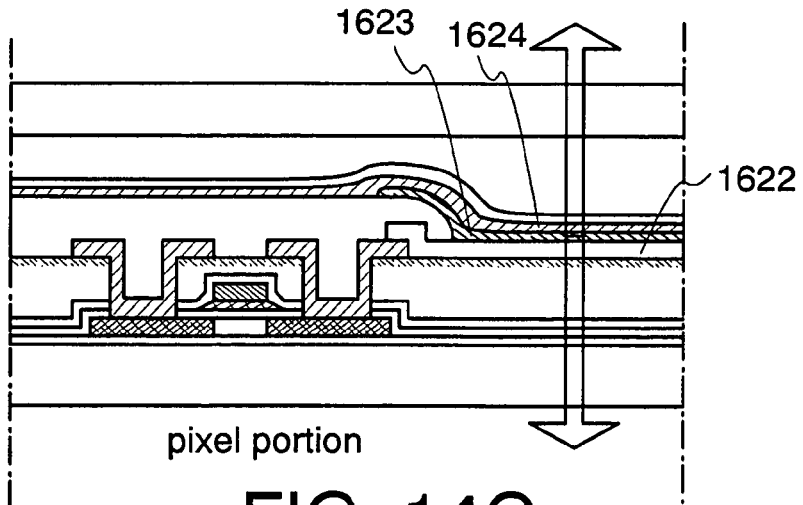

Meanwhile, a thin aluminum film, an aluminum film containing a minute amount of Li, or the like with a thickness of 1 nm to 10 nm is used for a cathode 1624 so that light is released out from the EL layer 1623; thus, a dual emission light emitting device in which light from the light emitting element can be released from top and bottom sides can be obtained (FIG. 14C).

The same material as the anode 1622, that is a transparent conductive film of ITO, ITSO, or the like, may be used for the cathode 1624 to obtain a dual emission light emitting device. In this case, silicon or silicon oxide may be contained in the transparent film, or a layered structure thereof may be used.

Next, the case of a top emission light emitting display device will be described with reference to FIG. 14A. In general, a top emission light-emitting device in which light from the light emitting element can be released to the opposite side of the substrate (a top side) can be obtained by replacing the anode 1622 (hole injection electrode) and the cathode 1624 (electron injection electrode) in a bottom emission type shown in FIG. 14B with each other, stacking the EL layer in reverse, and reversing the polarity of the current control transistor (here, an n-channel TFT). In the case where the electrodes and the EL layer are stacked in reverse, a layered structure of transparent conductive oxide layers having different concentration of silicon oxide is used as the anode 1622. Accordingly, a light-emitting device having high stability can be obtained due to the advantageous effects such as improvements in luminous efficiency and low power consumption. Here, a reflective metal conductive electrode or the like may be used as the cathode 1624.

Note that a top emission type light-emitting device can be obtained without exchanging the anode 1622 and the cathode 1624 in the bottom emission type shown in FIG. 14B by applying a transparent conductive layer such as ITO or ITSO to the anode 1622. A transparent conductive layer containing silicon or silicon oxide may be used or a layered structure thereof may be applied for the transparent conductive layer used for the anode.

Embodiment 7

In this embodiment, an example of a display panel including an inverted staggered TFT which can be fabricated through the similar steps described in Embodiment Mode 1 or other Embodiments.

Figure 18A:
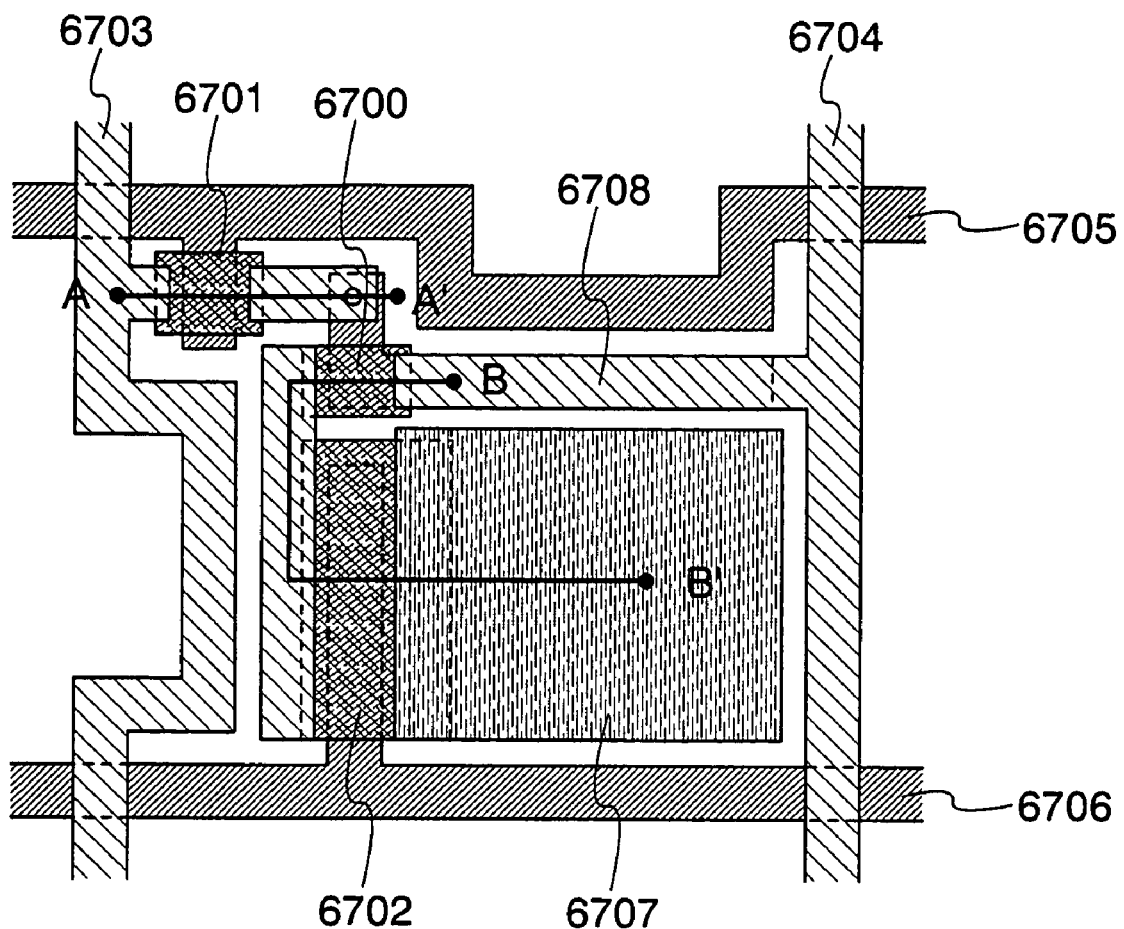
FIGS. 18A and 18B are top views of a pixel in a panel of an EL display device.
Figure 18B:
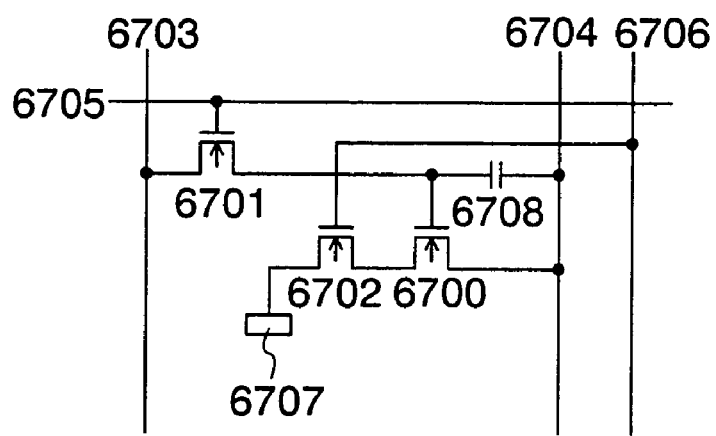

FIG. 18A shows a top view of a pixel of an EL display panel fabricated using an inverted staggered TFT. FIG. 18B shows a schematic diagram corresponding to the top view. In a pixel area of the EL display panel, each pixel is provided with an EL element 6707 and a first TFT 6700 for driving which controls and the light emission of the EL element 6707, a second TFT which controls on-off (switching) of the first TFT, a third TFT 6702 for driving which controls current supplied to the EL element and a capacitor 6708 for holding signal data. These TFTs can be each formed with an inverted staggered TFT shown in Embodiment Mode 1 or other Embodiments.

The first TFT 6700 is connected to a pixel electrode provided under the EL element 6707 through the third TFT 6702 and is operated to control light emission of the EL element 6707. The second TFT 6701 controls the behavior of the first TFT 6701 in response to signals of a scan line 6705 serving as a gate electrode of the second TFT 6701 and a signal line 6703, and on-off of the first TFT 6700 can be controlled. The gate electrode of the first TFT 6700 is connected to the second TFT 6701, and power is supplied from a power line 6704 in response to on-off of the gate to the pixel electrode side. Further, corresponding to the behavior of the EL element whose emission luminance changes according to the amount of current flow, a third TFT 6702 for current control which is connected to a fixed power line 6706 is provided; thus, constant current is supplied to the EL element 6707 from the power line 6704.

The EL element 6707 has a structure in which a layer containing organic compound layer (hereinafter referred to as an EL layer) where light emission occurs in returning back to a ground state from a singlet excited state (fluorescence) and/or light emission occurs in returning back to a ground state form a triplet excited state (phosphorescence) is sandwiched between a pair of electrodes (an anode and a cathode). A low molecular weight organic light emitting material, an intermediate molecular weight organic light emitting material (an organic light emitting material which is not sublimable and which has 20 or less molecules or has a molecule chain of 10 µm long at most), or a high molecular weight organic light emitting material may be used as an organic compound forming the EL layer. The EL layer may be formed with a single layer, or may be formed by stacking a plurality of layers having different functions. In the case of stacking a plurality of layers, a hole injection layer, a hole transport layer, a light emitting layer, an electron injection layer, an electron transport layer, and a hole or electron block layer may be appropriately used in combination. A hole injection layer and a hole transport layer are formed of materials with high hole mobility and holes can be injected from an electrode. The two functions can be merged to form one layer (a hole injection transport layer). The same goes for the case of an electron injection transport layer.

Figure 19A:
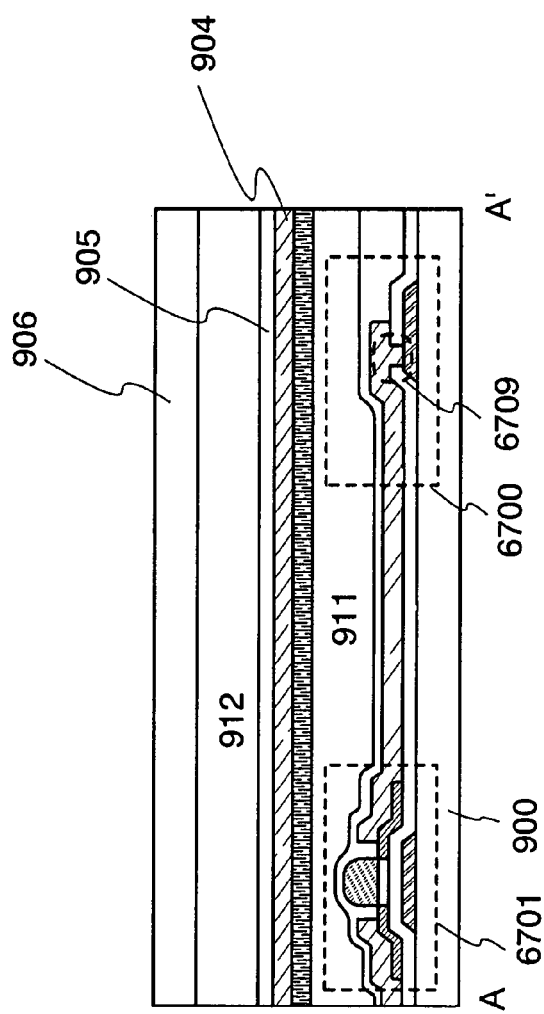
FIGS. 19A and 19B are cross-sectional views each showing a pixel in a panel of an EL display device.
Figure 19B:
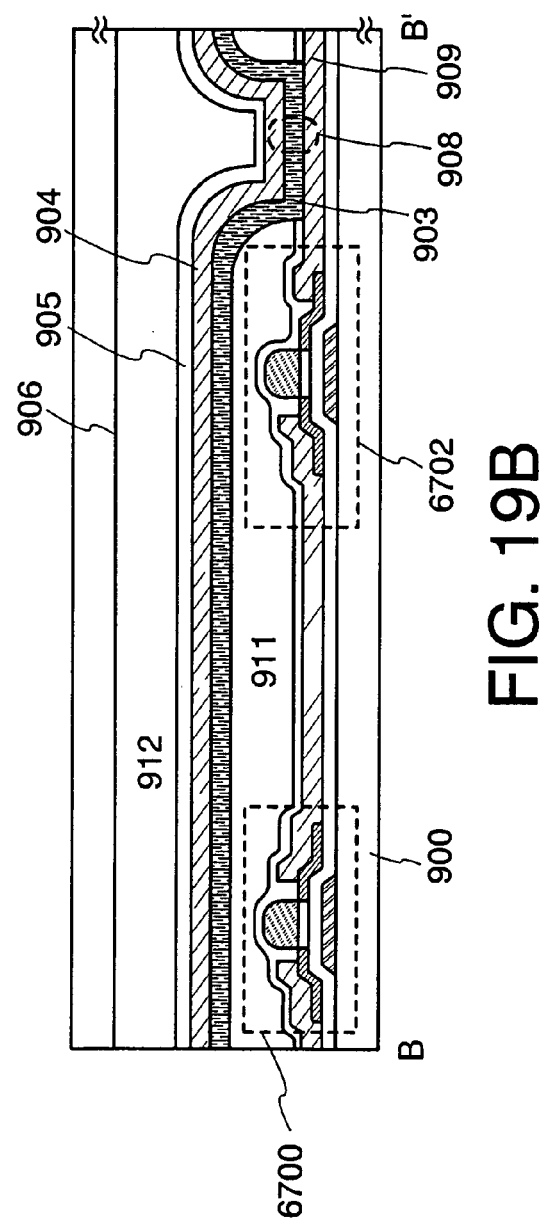

FIGS. 19A and 19B show cross sectional views along lines A-A' and B-B' in FIG. 18A. An active matrix EL display panel in which a light emitting element 908 is formed between a substrate 900 provided with a first TFT 6700, a second TFT 6701, a third TFT 6702, and the like; and a sealing substrate 906 is shown in FIG. 19B. The both sectional views include the first TFT 6700. The first TFT 6700 is connected to a pixel electrode 909 through the second TFT 6701. An insulator 911

(referred to as a partition wall, a bank, or the like) is provided, and a light emitting layer 903 and a counter electrode 904 are formed thereover; thus, the light emitting element 908 is formed. A passivation film 905 is formed over the light emitting element 908 and the light emitting element 908 is sealed with the sealing substrate 906 and a sealant. The space between the passivation film 905 and the sealing substrate 906 is filled with the insulator 912.

The insulators 911 and 912 may use one selected from silicon nitride, silicon oxide, silicon nitride oxide, aluminum nitride, aluminum oxynitride, aluminum nitride oxide, aluminum oxide, diamond like carbon (DLC), a carbon nitride film (CN); or a mixture thereof.

As another insulating material, one or more materials selected from polyimide, acrylic, benzocyclobutene, and polyamide may be used. Alternatively, a material in which a skeletal structure is composed of a bond of silicon (Si) and oxygen (O) and at least contains hydrogen as a substituent, or further contains at least one of fluorine, an alkyl group, and aromatic hydrocarbons as a substituent in addition to hydrogen (typically, siloxane resin) may be used. In the case where light is released from the sealing substrate 906 side (top emission type), a light transmitting material must be used as the insulator 912.

FIGS. 18A to 19B each show only one pixel; however, pixels having EL elements corresponding to R (red), G (green), and B (blue) may be combined to perform multiple color display. All the colors may use light emission which occurs in returning back to a ground state from a singlet excited state (fluorescence), all the colors may use light emission which occurs in returning to a ground state from a triplet excited state (phosphorescence), or one color may be fluorescence (or phosphorescence) and the rest of the two colors may be phosphorescence (fluorescence); thus, the light emission may be combined. Phosphorescence may be used for only R and fluorescence may be used for G and B. For example, a layered structure having a copper phthalocyanine (CuPc) film provided with a thickness of 20 nm as the hole injection layer and a tris-8-quinolinolato aluminum complex (Alq3) film provided thereover with a thickness of 70 nm may be used. Colors of light emission can be controlled by adding fluorescent dye such as quinacridone, perylene, or DCM 1 to $Alq_3$.

Another insulating material such as silicon nitride, silicon oxide, silicon oxynitride, aluminum nitride, aluminum oxynitride, aluminum oxide, diamond like carbon, or nitrogen containing carbon may be used for the passivation film 905. Alternatively, a material in which a skeletal structure is composed of a bond of silicon (Si) and oxygen (O) and at least contains hydrogen as a substituent, or further contains at least one of fluorine, an alkyl group, and aromatic hydrocarbons as a substituent in addition to hydrogen (typically, siloxane resin) may be used.

The invention can be applied to a dual emission light emitting display panel in which light is released from both sides of light emitting display panels, or to one side of a light emitting display panel. In the case where light is released from only the counter electrode 904 side (a top emission type), the pixel electrode 909 is a reflective conductive film equivalent to an anode. A conductive film having high work function such as platinum (Pt) or gold (Au) is used to serve as an anode. Since those metals are expensive, a pixel electrode may be used in which the metals are laminated on the appropriate conductive film such as an aluminum film or a tungsten film, so that platinum or gold is exposed on the outermost surface. The counter electrode 904 is a thin (preferably 10 nm to 50 nm) conductive film and made of a material containing an element having low work function which belongs to Group 1 or Group 2 of the periodic table (for example, Al, Mg, Ag, Li, Ca, or alloys thereof such as MgAg, MgAgAl, MgIn, LiAl, LiFAl, $CaF_2$, or CaN) to serve as a cathode. An oxide conductive film (typically, an ITO film) is formed and stacked over the counter electrode. In this case, the light emitted from the light emitting element is reflected by the pixel electrode 909 and released from the sealing substrate 906 through the counter electrode 904.

In the case where light is released from only the side of the pixel electrode 909 (bottom emission type), a transparent conductive film is used for the pixel electrode corresponding to an anode. A compound with indium oxide and tin oxide, a compound with indium oxide and zinc oxide, zinc oxide, tin oxide, or indium oxide may be used for the transparent conductive film. The counter electrode 904 preferably use a conductive film (film thickness of 50 nm to 200 nm) formed of Al, Mg, Ag, Li, or Ca or an alloy thereof such as MgAg, MgIn, or AlLi. In this case, light emitted from the light emitting element 908 is released from the side of the substrate 900 through the pixel electrode 909.

In the case of a dual emission type, in which light is released from the both pixel electrode 909 side and the counter electrode 906 side, a transparent conductive film is used for the pixel electrode 909 corresponding to an anode. ITO, ITSO, IZO, ZnO, tin oxide, indium oxide, or the like may be used for the transparent conductive film. The counter electrode 906 is a thin (preferably 10 nm to 50 nm) conductive film and uses a material containing an element having low metal work function which belongs to Group 1 or Group 2 of the periodic table (for example, Al, Mg, Ag, Li, Ca, or alloys thereof such as MgAg, MgAgAl, MgIn, LiAl, LiFAl, $CaF_2$, or CaN) to serve as a cathode. A traqnsparent oxide conductive film (typically, an ITO film or an ITSO film) is formed and stacked over the counter electrode 906. In this case, the light emitted from the light emitting element 908 is released from both the substrate 900 and the sealing substrate 906.

As to the EL display panel described above, the TFT can be fabricated by a droplet discharge method; thus, the number of steps is reduced and the manufacturing cost can be significantly reduced. In particular, in forming a contact hole 6709 for connecting the first TFT 6700 and the second TFT 6701, further reduction in the number of steps and the cost can be attempted by applying the invention. In this embodiment, an example of using an inverted staggered TFT shown in Embodiment Mode 1 or another Embodiment for a liquid crystal display panel has been shown; however, the invention can be similarly applied in the case of using a top gate TFT or staggered TFT shown in Embodiment Mode 2.

Embodiment 8

In this embodiment, a display panel used for a liquid crystal display device according to Embodiment 4 or a light emitting device according to Embodiment 5 will be described with reference to FIG. 15.

Figure 15:
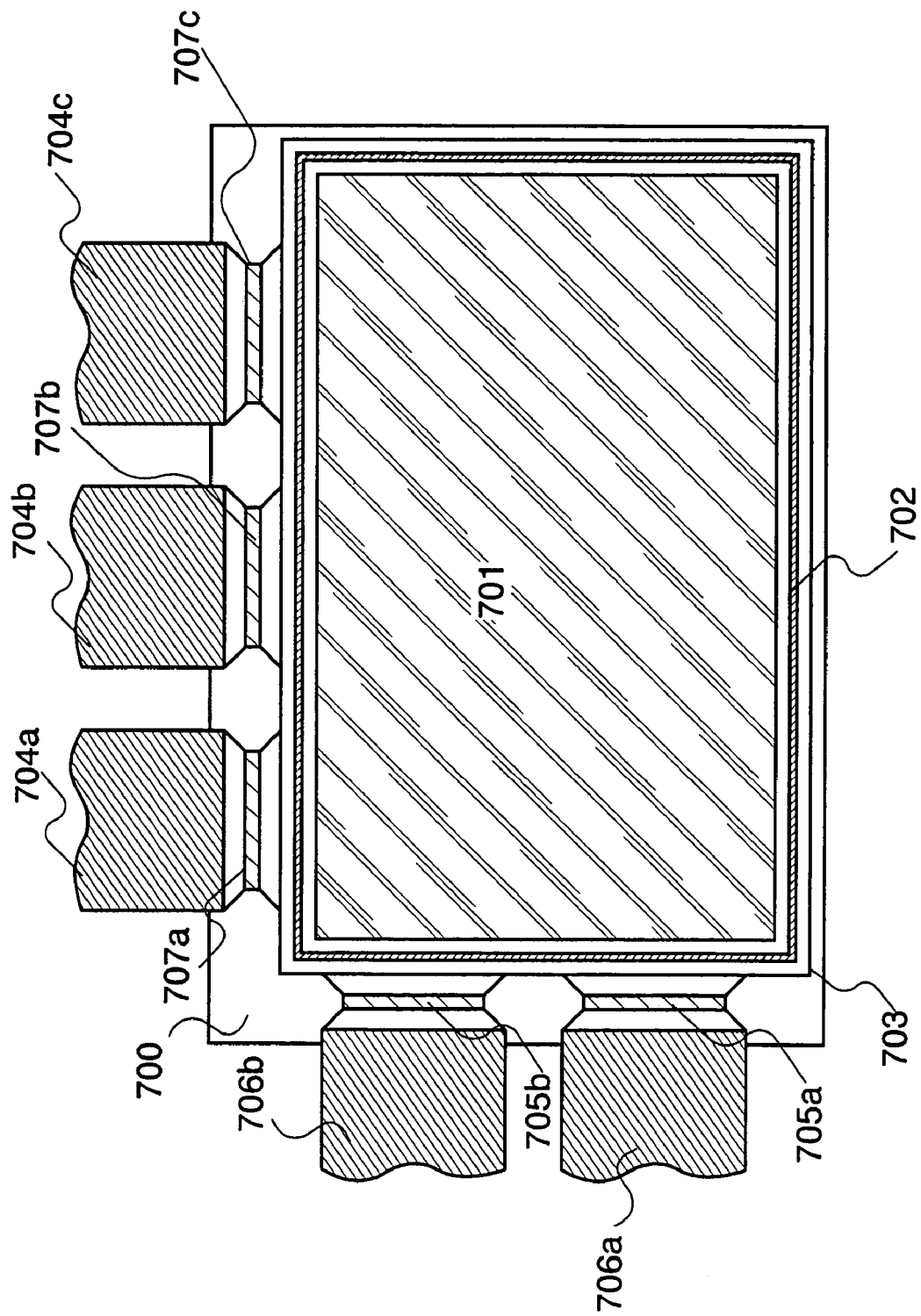
FIG. 15 is a figure showing a module of a display panel.

As to a module shown in FIG. 15, driver ICs including driver circuits are provided around a pixel area 701 in COG (Chip On Glass). Naturally, the driver ICs may be mounted in TAB (Tape Automated Bonding)

A substrate 700 is fixed with a counter substrate 703 and a sealant 702. The pixel area 701 may have liquid crystal as a display element as shown in Embodiment 4, or may have an EL element as a display element as shown in Embodiment 5. Driver ICs 705a and 705b and driver ICs 707c to 707a can each have a integrated circuit which is formed of a single crystal semiconductor or a polycrystal semiconductor. The driver ICs 705*a* and 705*b* and driver ICs 707*c* to 707*a* are supplied with signals or power through FPCs 704*c* to 704*a*, 706*a*, or 706*b*.

Embodiment 9

As examples of electronic devices using a module according to Embodiment 8, a television, a portable book (an electronic book), a cellular phone shown in FIG. 16A to 16C will be described.

Figure 16A:
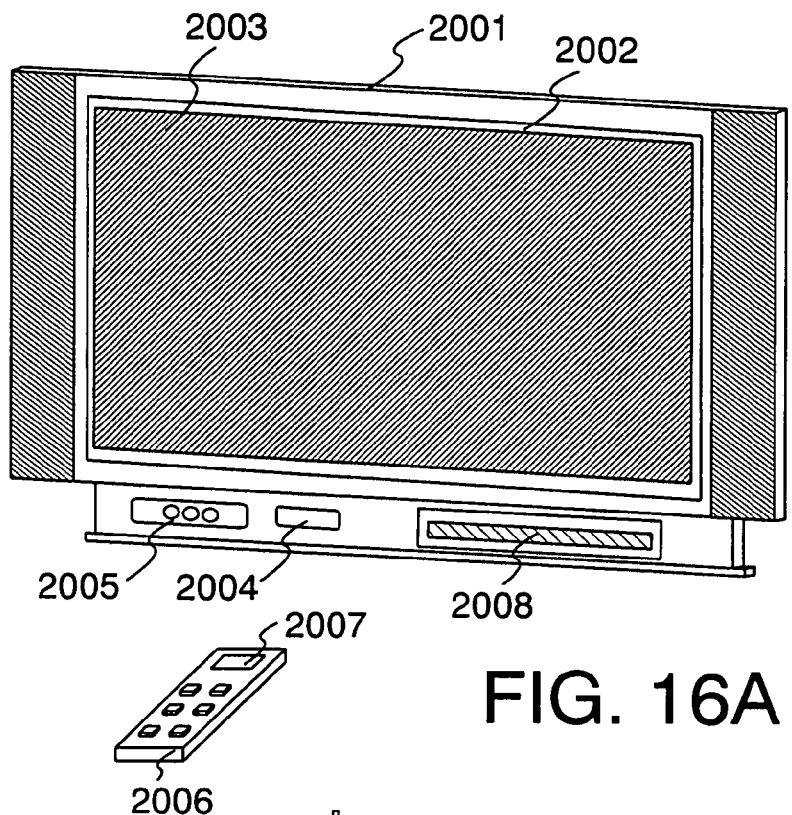
FIGS. 16A to 16C are figures describing examples of display devices.
Figure 16B:
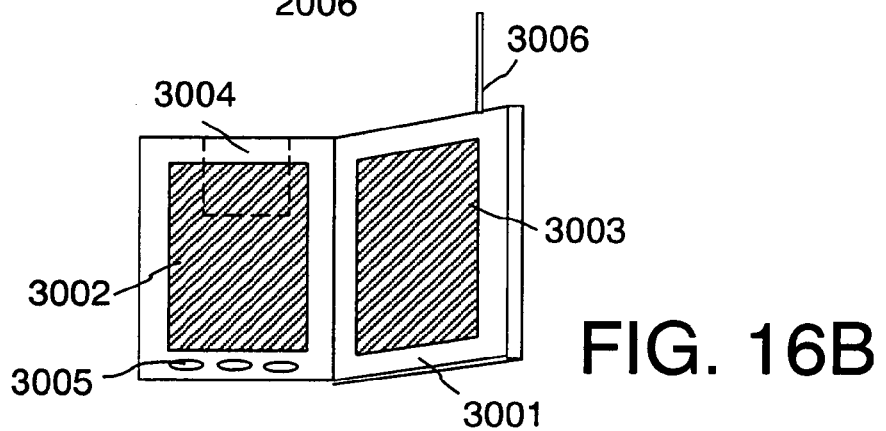
Figure 16C:
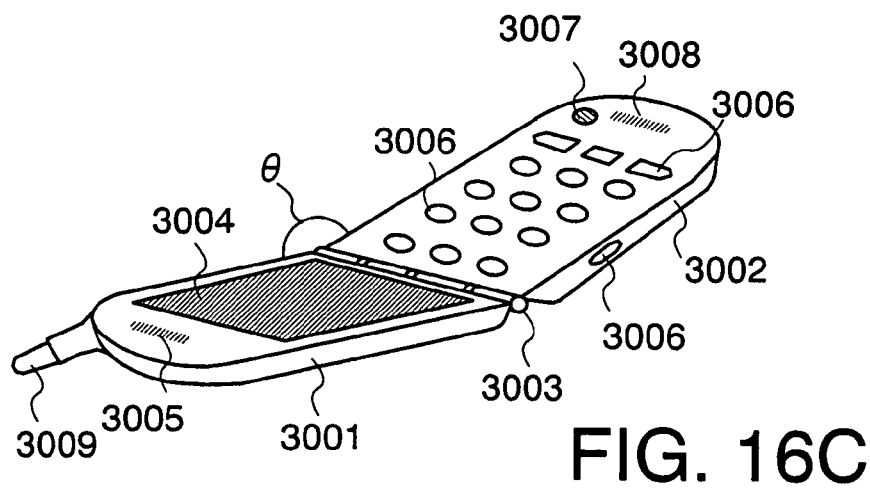

As to a television shown in FIG. 16A, a display module 2002 having liquid crystal or an EL element is incorporated in a chassis 2001. One-way (a sender to a receiver) or two way (a sender and a receiver, or receivers) information communication including reception of general television broadcast via a modem 2004 can be performed with the use of a receiver 2005. The television can be operated by using a switch on the chassis or a remote controller 2006. The remote controller 2006 may also be provided with a display area 2007 where information is displayed.

In the television, a sub screen 2008 formed from a second screen module may be provided in addition to a main screen 2003 in order to display the channel or the volume. In such a structure, the main screen 2003 may be formed from an EL module having wide viewing angle or may be fabricated from a liquid crystal display module. Alternatively, in the case of prioritizing low power consumption, the main screen 2003 may be formed from a liquid crystal display module and the sub screen may be formed of an EL display module, and the sub screen may have a blinking function.

FIG. 15B shows a portable book (electronic notebook) including a main body 3101, display areas 3102 and 3013, a record medium 3104, an operation switch 3105, an antenna 3106.

FIG. 15C shows a cellular phone including a display panel 3001 and an operation panel 3002. The display panel 3001 and the operation panel 3002 are connected to each other in a joint 3003. As to the joint 3003, the angle θ of a face which is provided with the display area 3004 of the display panel 3001 and a face which is provided with the operation key 3006 of the operation panel 3002 can be changed arbitrary. Further, a voice output section 3005, a power switch 3007, a sound input section 3008 and an antenna are also included.

The number of steps is significantly reduced according to the invention, a television, a portable book, a cellular phone, or the like with a large screen can be manufactured with high yield at low cost.

Embodiment 10

In the above embodiments, the application of the present invention to a display has been mainly described; however, the invention can be applied to other devices in other fields. For example, a contact hole has been made by photolithography in the LSI fabrication process. However, as in this embodiment, by using a liquid repellent material for a first organic film (a film for covering a part to be a contact hole), a good contact hole, and a second organic film serving as an interlayer insulating film, a planarizing film, a gate insulating film, or the like can be formed in a desired portion.

For example, it is not shown; however, a liquid repellent first organic film is formed by a droplet discharge method, a second organic film is formed around the first organic film, and the first organic film is thereafter removed; thus, a contact hole, and a second organic film serving as an interlayer insulating film, a planarizing film, a gate insulating film, or the like can be formed in a desired portion. Here, as such insulating films, an inorganic film of such as PSG (phosphorus silicate glass), BPSG (boron phosphorus silicate glass), SiOF may be used instead of the second organic thin film. Such an inorganic film can be formed by LPCVD, coating, a high density plasma process, or the like.

In fabricating an active matrix substrate as above, if a material which is liquid repellent against such an inorganic insulating film is selected for the first organic film, or liquid repellent treatment is applied to an organic film to form the first organic film; the above inorganic film can be used instead of the second organic film.

As in the present invention, by using a liquid repellent material for a first organic film (a film for covering a part to be a contact hole), a second organic film serving as an interlayer insulating film can be formed in a desired portion. Further, a preferable contact hole can be formed in a desired portion after removing the first organic film. Thus, a contact hole and an insulating film can be formed without performing exposure and development using a resist mask. Accordingly, the process can be significantly simplified compared to conventional process. Consequently, a method for fabricating a semiconductor device with high throughput and high yield at low cost can be provided.

The present invention offering these advantages can be applied to a variety of semiconductor devices including an inverted staggered TFT, a top gate TFT, or the like as also show in Embodiments. Further, the invention can be applied to a fabrication method of an active matrix substrate using the semiconductor device and a display of such as a liquid crystal display device or an EL display device which uses the substrate, and also to the field of LSIs. Thus, the invention can provide wide range of applications.

What is claimed is:

1. A fabrication method of a semiconductor device, comprising the steps of:

selectively forming a first organic film which is liquid repellent on a film;

forming a second organic film on a portion of the film where the first organic film is not formed;

removing the first organic film after forming the second organic film so that the second organic film has a contact hole; and forming a conductive film on the second organic film and in the contact hole, wherein the conductive film is in contact with the film.

2. The fabrication method of the semiconductor device according to claim 1, wherein the first organic film is formed of a material of a chemical formula $R_n$—Si—$X_{4-n}$ (n=1, 2, 3); in which R is an alkyl group, a vinyl group, an amino group, or an epoxy group;

and X is halogen, a methoxy group, an ethoxy group, or an acetoxy group.

3. The fabrication method of the semiconductor device according to claim 1, wherein the first organic film is made of FAS (fluoroalkyl silane).

4. The fabrication method of the semiconductor device according to claim 1, wherein the second organic film contains one selected from the group consisting of acrylic resin, polyimide resin, and siloxane resin.

5. The fabrication method of the semiconductor device according to claim 1, wherein the semiconductor device is a top gate TFT.

6. The fabrication method of the semiconductor device according to claim 1, wherein the semiconductor device is an inverted staggered TFT.

7. The fabrication method of the semiconductor device according to claim 1, wherein the semiconductor device is used in a liquid crystal device.

8. The fabrication method of the semiconductor device according to claim 1, wherein the semiconductor device is used in an EL display device.

9. The fabrication method of the semiconductor device according to claim 1, wherein the semiconductor device is used in one selected from the group consisting of a television, a portable book, and a cellular phone.

10. The fabrication method of the semiconductor device according to claim 1, wherein the film is a semiconductor film.

11. The fabrication method of the semiconductor device according to claim 1, wherein the film is a conductive film.

12. The fabrication method of the semiconductor device according to claim 1, wherein the film is an insulating film.

13. The fabrication method of the semiconductor device comprising the steps of:
selectively forming a first organic film which is liquid repellent on a film;
forming a second organic film on a portion of the film where the first organic film is not formed;
removing the first organic film after forming the second organic film so that the second organic film has a contact hole; and
forming a conductive film on the second organic film and in the contact hole.

14. The fabrication method of the semiconductor device according to claim 13,
wherein the first organic film is formed of a material of a chemical formula $R_n$—Si—$X_{4-n}$ (n=1, 2, 3); in which R is an alkyl group, a vinyl group, an amino group, or an epoxy group;
and X is halogen, a methoxy group, an ethoxy group, or an acetoxy group.

15. The fabrication method of the semiconductor device according to claim 13,
wherein the first organic film is made of FAS (fluoroalkyl silane).

16. The fabrication method of the semiconductor device according to claim 13,
wherein the second organic film contains one selected from the group consisting of acrylic resin, polyimide resin, and siloxane resin.

17. The fabrication method of the semiconductor device according to claim 13, wherein the semiconductor device is a top gate TFT.

18. The fabrication method of the semiconductor device according to claim 13, wherein the semiconductor device is an inverted staggered TFT.

19. The fabrication method of the semiconductor device according to claim 13, wherein the semiconductor device is used in a liquid crystal device.

20. The fabrication method of the semiconductor device according to claim 13, wherein the semiconductor device is used in an EL display device.

21. The fabrication method of the semiconductor device according to claim 13, wherein the semiconductor device is used in one selected from the group consisting of a television, a portable book, and a cellular phone.

22. A fabrication method of a semiconductor device comprising of:
selectively forming a first organic film which is liquid repellent by a droplet discharge method on a film;
forming a second organic film on a portion of the film where the first organic film is not formed;
removing the first organic film after forming the second organic film so that the second organic film has a contact hole; and
selectively forming a conductive film on the second organic film and in the contact hole by a droplet discharge method.

23. The fabrication method of the semiconductor device according to claim 22,
wherein the first organic film is formed of a material of a chemical formula $R_n$—Si—$X_{4-n}$ (n=1, 2, 3); in which R is an alkyl group, a vinyl group, an amino group, or an epoxy group;
and X is halogen, a methoxy group, an ethoxy group, or an acetoxy group.

24. The fabrication method of the semiconductor device according to claim 22,
wherein the first organic film is made of FAS (fluoroalkyl silane).

25. The fabrication method of the semiconductor device according to claim 22,
wherein the second organic film contains one selected from the group consisting of acrylic resin, polyimide resin, and siloxane resin.

26. The fabrication method of the semiconductor device according to claim 22, wherein the semiconductor device is a top gate TFT.

27. The fabrication method of the semiconductor device according to claim 1, wherein the semiconductor device is an inverted staggered TFT.

28. The fabrication method of the semiconductor device according to claim 22, wherein the semiconductor device is used in a liquid crystal device.

29. The fabrication method of the semiconductor device according to claim 22, wherein the semiconductor device is used in an EL display device.

30. The fabrication method of the semiconductor device according to claim 22, wherein the semiconductor device is used in one selected from the group consisting of a television, a portable book, and a cellular phone.

31. A fabrication method of a semiconductor device comprising the steps of:
selectively forming a first organic film on a film;
performing a plasma treatment to the first organic film;
forming a second organic film on a portion of the film where the first organic film is not formed; and
removing the first organic film after forming the second organic film so that the second organic film has a contact hole.

32. The fabrication method of the semiconductor device according to claim 31,
wherein the first organic film contains a water soluble resin.

33. The fabrication method of the semiconductor device according to claim 31,
wherein the first organic film contains PVA (polyvinyl alcohol).

34. The fabrication method of the semiconductor device according to claim 31,
wherein the plasma treatment is performed using a fluorine-based gas.

35. The fabrication method of the semiconductor device according to claim 31,
wherein the plasma treatment is performed using $CF_4$ gas.

36. The fabrication method of the semiconductor device according to claim 31, wherein the semiconductor device is a top gate TFT.

37. The fabrication method of the semiconductor device according to claim 31, wherein the semiconductor device is an inverted staggered TFT.

38. The fabrication method of the semiconductor device according to claim 31, wherein the semiconductor device is used in a liquid crystal device.

39. The fabrication method of the semiconductor device according to claim 31, wherein the semiconductor device is used in an EL display device.

40. The fabrication method of the semiconductor device according to claim 31, wherein the semiconductor device is used in one selected from the group consisting of a television, a portable book, and a cellular phone.

41. A fabrication method of a semiconductor Device, comprising the steps of:
selectively forming a first organic film on a film;
performing a plasma treatment to the first organic film;
forming a second organic film on a portion of the film where the first organic film is not formed;
removing the first organic film after forming the second organic film so that the second organic film has a contact hole; and
forming a conductive film on the second organic film and in the contact hole.

42. The fabrication method of the semiconductor device according to claim 41,
wherein the first organic film contains a water soluble resin.

43. The fabrication method of the semiconductor device according to claim 41,
wherein the first organic film contains PVA (polyvinyl alcohol).

44. The fabrication method of the semiconductor device according to claim 41,
wherein the plasma treatment is performed using a fluorine-based gas.

45. The fabrication method of the semiconductor device according to claim 41,
wherein the plasma treatment is performed using $CF_4$ gas.

46. The fabrication method of the semiconductor device according to claim 41, wherein the semiconductor device is a top gate TFT.

47. The fabrication method of the semiconductor device according to claim 41, wherein the semiconductor device is an inverted staggered TFT.

48. The fabrication method of the semiconductor device according to claim 41, wherein the semiconductor device is used in a liquid crystal device.

49. The fabrication method of the semiconductor device according to claim 41, wherein the semiconductor device is used in an EL display device.

50. The fabrication method of the semiconductor device according to claim 41, wherein the semiconductor device is used in one selected from the group consisting of a television, a portable book, and a cellular phone.

51. A fabrication method of a semiconductor device comprising the steps of:
selectively forming a first organic film by a droplet discharge method on a film;
performing a plasma treatment to the first organic film;
forming a second organic film on a portion of the film where the first organic film is not formed;
removing the first organic film after forming the second organic film so that the second organic film has a contact hole; and
selectively forming a conductive film on the second organic film and in the contact hole by liquid discharge method.

52. The fabrication method of the semiconductor device according to claim 51,
wherein the first organic film contains a water soluble resin.

53. The fabrication method of the semiconductor device according to claim 51,
wherein the first organic film contains PVA (polyvinyl alcohol).

54. The fabrication method of the semiconductor device according to claim 51,
wherein the plasma treatment is performed using a fluorine-based gas.

55. The fabrication method of the semiconductor device according to claim 51,
wherein the plasma treatment is performed using $CF_4$ gas.

56. The fabrication method of the semiconductor device according to claim 51, wherein the semiconductor device is a top gate TFT.

57. The fabrication method of the semiconductor device according to claim 51, wherein the semiconductor device is an inverted staggered TFT.

58. The fabrication method of the semiconductor device according to claim 51, wherein the semiconductor device is used in a liquid crystal device.

59. The fabrication method of the semiconductor device according to claim 51, wherein the semiconductor device is used in an EL display device.

60. The fabrication method of the semiconductor device according to claim 51, wherein the semiconductor device is used in one selected from the group consisting of a television, a portable book, and a cellular phone.

61. A fabrication method of an active matrix display device, comprising the steps of:
selectively forming a first organic film which is liquid repellent on a film;
forming a second organic film on a portion of the film where the first organic film is not formed; and
removing the first organic film after forming the second organic film so that the second organic film has a contact hole.

62. The fabrication method of the active matrix display device according to claim 61,
wherein the first organic film is formed of a material of a chemical formula $R_n$—Si—$X_{4-n}$ (n=1, 2, 3); in which R is an alkyl group, a vinyl group, an amino group, or an epoxy group;
and X is halogen, a methoxy group, an ethoxy group, or an acetoxy group.

63. The fabrication method of the active matrix display device according to claim 61,
wherein the first organic film is made of FAS (fluoroalkyl silane).

64. The fabrication method of the active matrix display device according to claim 61,
wherein the second organic film contains one selected from the group consisting of acrylic resin, polyimide resin, and siloxane resin.

65. A fabrication method of an active matrix display device comprising the steps of:
selectively forming a first organic film on a film;
performing a plasma treatment to the first organic film;
forming a second organic film on a portion of the film where the first organic film is not formed; and forming a contact hole at a part where the first organic film has been formed by removing the first organic film after forming the second organic film.

66. The fabrication method of the active matrix display device according to claim 65, wherein the first organic film contains a water soluble resin.

67. The fabrication method of the active matrix display device according to claim 65, wherein the first organic film contains PVA (polyvinyl alcohol).

68. The fabrication method of the active matrix display device according to claim 65, wherein the plasma treatment is performed using a fluorine-based gas.

69. The fabrication method of the active matrix display device according to claim 65, wherein the plasma treatment is performed using $CF_4$ gas.

70. A fabrication method of a semiconductor device, comprising the steps of:

selectively forming a first organic film which is liquid repellent on a film in a first region;

forming a second organic film in a second region;

removing the first organic film after forming the second organic film so that a contact hole is formed in the first region; and forming a conductive film on the second organic film and in the contact hole, wherein the conductive film is in contact with the film.

71. The fabrication method of the semiconductor device according to claim 70, wherein the first organic film is formed of a material of a chemical formula $R_n-Si-X_{4-n}$ (n=1, 2, 3); in which R is an alkyl group, a vinyl group, an amino group, or an epoxy group;

and X is halogen, a methoxy group, an ethoxy group, or an acetoxy group.

72. The fabrication method of the semiconductor device according to claim 70, wherein the first organic film is made of FAS (fluoroalkyl silane).

73. The fabrication method of the semiconductor device according to claim 70, wherein the second organic film contains one selected from the group consisting of acrylic resin, polyimide resin, and siloxane resin.

74. The fabrication method of the semiconductor device according to claim 70, wherein the semiconductor device is a top gate TFT.

75. The fabrication method of the semiconductor device according to claim 70, wherein the semiconductor device is an inverted staggered TFT.

76. The fabrication method of the semiconductor device according to claim 70, wherein the semiconductor device is used in a liquid crystal device.

77. The fabrication method of the semiconductor device according to claim 70, wherein the semiconductor device is used in an EL display device.

78. The fabrication method of the semiconductor device according to claim 70, wherein the semiconductor device is used in one selected from the group consisting of a television, a portable book, and a cellular phone.

* * * * *